(12) United States Patent
Kim

(10) Patent No.: US 6,292,385 B1
(45) Date of Patent: Sep. 18, 2001

(54) FERROELECTRIC RANDOM ACCESS MEMORY

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/676,521

(22) Filed: Sep. 29, 2000

(30) Foreign Application Priority Data

Sep. 30, 1999 (KR) .................................................. 99-42045

(51) Int. Cl.$^7$ .................................................. G11C 11/22
(52) U.S. Cl. .................................................. 365/145; 365/210
(58) Field of Search .................................. 365/145, 222, 365/210, 189.07, 230.06

(56) References Cited

U.S. PATENT DOCUMENTS

| | | | |
|---|---|---|---|
| 4,161,038 | * | 7/1979 | Wu .......................................... 365/45 |
| 4,873,664 | | 10/1989 | Eaton, Jr. . |
| 5,414,654 | | 5/1995 | Kubota et al. . |
| 5,487,032 | | 1/1996 | Mihara et al. . |
| 5,926,413 | | 7/1999 | Yamada et al. . |
| 5,969,981 | | 10/1999 | Kono et al. . |
| 6,111,777 | | 8/2000 | Ogiwara et al. . |

\* cited by examiner

Primary Examiner—Terrell W. Fears
(74) Attorney, Agent, or Firm—Timothy J. Keefer; Wildman, Harrold, Allen & Dixon

(57) ABSTRACT

A ferroelectric random access memory including a plurality of bit lines extending in one direction, a plurality of word lines extending in another direction perpendicular to the one direction, and a plurality of unit cells arranged in an M×N array while being connected to associated ones of the lines. The unit cells are grouped into a plurality of unit cell groups. A dummy cell group comprises a plurality of dummy cells that are connected to an associated one of the bit lines of an optional position on the associated bit line. A first switching transistor group comprises a plurality of switching transistors that serve to switch a connection among associated ones of the unit cells on one of the bit lines corresponding to an associated one of the dummy cells in response to a control signal externally applied thereto, and a second switching transistor group comprises a plurality of switching transistors that serve to erase data stored in an associated one of the dummy cells in response to a control signal externally applied thereto. Respective capacitors of the dummy cells are made of a dielectric film having no spontaneous polarization characteristic.

51 Claims, 14 Drawing Sheets

FERROELECTRIC RANDOM ACCESS MEMORY

CROSS REFERENCE TO RELATED APPLICATION

This application claims the priority of Korean patent application Serial No. 99-42045 filed on Sep. 30, 1999.

BACKGROUND OF THE INVENTION

1. Field of the Invention

The present invention relates to a ferroelectric memory device, and more particularly to a ferroelectric random access memory device fabricated using a ferroelectric material having a perovskite structure to obtain an enhanced reliability when data is read out.

2. Description of the Related Art

As well known, semiconductor memory devices are classified into volatile memory devices and non-volatile memory devices in accordance with whether or not information is lost when power is off. A dynamic random access memory (DRAM), which is a volatile memory, is configured to keep information only in a power-on state even though it has a high operating speed. Such a DRAM also has a drawback in that the consumption of power is excessive because refreshing of data should be carried out at intervals of a certain time in order to prevent data from being lost due to leakage current from a charge transfer transistor coupled to a capacitor. Meanwhile, EEPROMs and flash memories, which are non-volatile memories, have drawbacks of a low operating speed and an excessive power consumption even though data can kept in a power-off state.

On the other hand, a ferroelectric random access memory (FeRAM) has advantages in that they have an operating speed similar to that of DRAMs while exhibiting a reduced power consumption. Such an FeRAM is a non-volatile memory capable of keeping data even in a power-off state, like EEPROMs and flash memories. By virtue of these advantages, such an FeRAM has recently been recognized as a substitutive memory for DRAMs, EEPROMs, flash memories, and other semiconductor memories. In accordance with such a recognition, active research and development have been made for FeRAMs in many companies and research institutes in the world.

Such an FeRAM uses a capacitor made of a ferroelectric film, such as PZT($Pb(Zr, Ti)O_3$) or SBT($SrBi_2Ta_2O_9$), having spontaneous polarization characteristics capable of maintaining a polarization generated in accordance with an application of a certain voltage, even after power is off. Such an FeRAM utilizes the hysteretic characteristics of a ferroelectric depicted in FIG. 1.

Referring to FIG. 1, the ferroelectric is polarized when a voltage V applied to the ferroelectric is increased in a plus (+) direction, so that it exhibits a maximum polarized value Qmax at a maximum voltage. When the applied voltage is cut off, the residual polarization of the ferroelectric corresponds to "Qr". This residual polarization value Qr corresponds to data "1". When the voltage V is decreased in a minus (−) direction, the ferroelectric is polarized in an opposite direction, so that it exhibits a minimum polarized value Qmin at a minimum voltage. When the applied voltage is cut off in this state, the residual polarization of the ferroelectric corresponds to "−Qr". This residual polarization value −Qr corresponds to data "0".

Here, the "+" and "−" directions of the voltage V are indicative of different relative potential relations between the upper and lower electrodes of the capacitor, respectively. The "+" direction means that the upper electrode has a potential relatively higher than that of the lower electrode. The "−" direction means that the upper electrode has a potential relatively lower than that of the lower electrode.

This will be described in more detail, in conjunction with FIG. 6 which is a circuit diagram illustrating the equivalent circuit of a conventional FeRAM. In order to store data "1" in a capacitor of a unit cell UC in the circuit of FIG. 5, a potential, which is higher than that applied to a plate electrode, is applied to a bit line in an ON state of a charge transfer transistor, thereby causing a ferroelectric to be spontaneously polarized. After the spontaneous polarization of the ferroelectric, the charge transfer transistor is turned off, so that data "1" is stored. On the other hand, data "0" is stored by applying, to the bit line, a potential lower than the potential applied to the plate electrode in the ON state of the charge transfer transistor, thereby spontaneously polarizing the ferroelectric, and then turning off the charge transfer transistor.

When data stored in the capacitor is to be read out from the memory, the charge transfer transistor is turned off in a state in which a potential higher than that applied to the plate electrode is applied to the bit line. As a result, a charge dQ1 is discharged into the bit line when the data stored in the capacitor is "1". When the data stored in the capacitor is "0", a charge dQ0 is discharged into the bit line. That is, the potential of the bit line varies in accordance with the value of the data stored in the capacitor because the charge discharged into the bit line varies in accordance with the value of the stored data.

When the data stored in the capacitor is "1", the potential variation V1 on the bit line corresponds to "dQ1/(Cb +Cs)" (V1=dQ1/(Cb+Cs)). On the other hand, the data stored in the capacitor is "0", the potential variation V0 on the bit line corresponds to "dQ0/(Cb+Ca)" (V0=dQ0/(Cb+Cs)). Therefore, it is possible to determine the data ("1" or "0") by comparing the potential on the bit line, outputted at an output terminal (not shown) of the memory, with a reference potential.

The conventional FeRAM shown in FIG. 6 consists of unit cells UC each having a 1T/1C structure including one transistor and one capacitor.

Referring to FIG. 6, the FeRAM includes M+N unit cells. Each unit cell UC consists of one transistor (a charge transfer transistor), and one capacitor. The transistor of each unit cell UC is coupled at a gate thereof to an associated one of word lines WL0, WL1, and WL2, at a drain (or a source) thereof to an associated one of bit lines BL0 and BL1, and at a source (a drain) thereof to one end of the capacitor included in the unit cell UC. The other end of the capacitor is connected to an associated one of plate electrode lines PL0, PL1 and PL2. Each bit line BL0 or BL1 is coupled at one end thereof to an associated one of comparators C0 and C1.

The above mentioned convention FeRAM also includes a reference voltage generating circuit. This reference voltage generating circuit includes two switching transistors ST0 and ST1, and two dummy cells DC0 and DC1. Each of the dummy cells DC0 and DC1 consists of one transistor (a charge transfer transistor), and one capacitor. Respective transistors of the dummy cells DC0 and DC1 are coupled at their drains (or sources) to dummy bit lines DBL and /DBL, and coupled to each other via switching transistors ST0 and ST1 respectively connected to the dummy bit lines DBL and /DBL, thereby forming a common output. The common output from the switching transistors ST0 and ST1 is coupled to the other input of each of the comparators C0 and C1.

That is, each of the comparators C0 and C1 is coupled at one input thereof to an associated one of the bit lines BL0 and BL1, and at the other input thereof to the common output of the dummy bit lines DBL and /DBL. Accordingly, each comparator C0 or C1 determines data ("0" or "1") outputted from an optional unit cell UC by comparing the voltage of the unit cell UC, applied thereto via the associated bit line, with a reference voltage applied thereto from the common output of the switching transistors ST0 and ST1.

Meanwhile, a ferroelectric film, which is used for an FeRAM having the above mentioned configuration, exhibits an inferior resistance to a fatigue degradation over a typical capacitor. For this reason, the number of repeated write times of such a ferroelectric film is typically $10^{12}$ less than that of typical capacitors, that is, $10^{15}$.

In the above mentioned convention FeRAM, the dummy cells DC0 and DC1 are used every time data is stored in or read out from associated unit cells, respectively. For this reason, these dummy cells are used for the number of times considerably more than that of each unit cell in which data is actually stored. As a result, the dummy cells may be degraded earlier than the unit cells.

For example, in the case of an FeRAM including 256 K unit cells, that is, an FeRAM having a unit memory block arrangement in which 256 unit cells are arranged on one bit line, and 1,024 unit cells are arranged on one word line, each dummy cell conducts a read or write procedure for 256 K times when one unit cell conducts a read or write procedure once.

The number of repeated using times actually allowed in a semiconductor memory is determined, not based on the unit cell, but based on the dummy cell. For this reason, the number of repeated using times actually allowed in an FeRAM is determined, not to be $10^{12}$, which is an theoretical value, but to be $10^7$. In other words, the conventional FeRAM having a 1T/1C structure has a problem in that the actual number of repeated using times is considerably less than the theoretical number of repeated using times.

FIG. 7 is an equivalent circuit diagram illustrating a part of a conventional FeRAM having a 2T/2C structure consisting of two transistors and two capacitors.

The FeRAM shown in FIG. 7 configures each unit cell UC by two transistors (charge transfer transistors) and two capacitors in such a fashion that a reference voltage to be compared with the potential of a bit line adjacent to the unit cell UC is generated from the unit cell UC, as compared to the FeRAM of FIG. 6 including a separate reference voltage generating circuit.

Since each unit cell UC generates a reference voltage to be compared with the potential of a bit line adjacent thereto, the FeRAM having the 2T/2C structure can eliminate the problems involved in the FeRAM having the 1T/1C structure, that is, an RC delayer and a drop of the reference voltage.

However, the FeRAM having the 2T/2C structure has an increased unit cell size because two charge transfer transistors are formed for each unit cell. As a result, this FeRAM has a fatal problem in that it is impossible to achieve a high integration.

SUMMARY OF THE INVENTION

A first object of the invention is to provide an FeRAM capable of allowing the number of times using a dummy cell to correspond to the number of times using a unit cell, thereby preventing the number of times repeatedly using the memory to be reduced.

A second object of the invention is to provide an FeRAM capable of preventing the number of times repeatedly using the memory to be reduced, while easily achieving a high integration.

A third object of the invention is to provide an FeRAM capable of achieving a high integration and an increase in capacitance.

In accordance with one aspect, the present invention provides a ferroelectric random access memory comprising a plurality of bit lines extending in one direction, a plurality of word lines extending in another direction perpendicular to the one direction, and a plurality of unit cells arranged in an M+N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; further comprising: a dummy cell group consisting of a plurality of dummy cells each connected to an associated one of the bit lines at an optional position on the associated bit line, each of the dummy cells consisting of one transistor and one capacitor; a first switching transistor group consisting of a plurality of switching transistors each serving to switch a connection among associated ones of the unit cells on one of the bit lines corresponding to an associated one of the dummy cells in response to a control signal externally applied thereto; and a second switching transistor group consisting of a plurality of switching transistors each serving to erase data stored in an associated one of the dummy cells in response to a control signal externally applied thereto; wherein respective capacitors of the dummy cells are made of a dielectric film having no spontaneous polarization characteristic; whereby when data is read out from an optional one of the unit cells on a selected one of the bit lines, a predetermined voltage outputted from that of dummy cells connected to an inverted bit line neighboring to the selected bit line is provided as a reference voltage required for a comparison with a voltage corresponding to the read-out data.

In accordance with another aspect, the present invention provides a ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; wherein the bit lines are arranged in pair, each of the bit line pairs consisting of two bit lines; further comprising: a dummy cell group consisting of a plurality of dummy cells each connected to one of bit lines included in an associated one of the bit line pairs at an optional position on the bit line, each of the dummy cells consisting of one transistor and one capacitor; a first switching transistor group consisting of a plurality of switching transistors each serving to switch a connection among the unit cells on one bit line included in an associated one of the bit line pairs respectively corresponding to the dummy cells in response to a control signal externally applied thereto; a second switching transistor group consisting of a plurality of switching transistors each serving to switch a connection between the bit lines included in an associated one of the bit line pairs respectively corresponding to the dummy cells in response to a control signal externally applied thereto, the switching transistors of the second switching transistor group corresponding in number to the dummy cells; and a third switching transistor group consisting of a plurality of switching transistors each serving to erase data stored in an associated one of the dummy cells in response to a control signal externally applied thereto; wherein respective capacitors of the dummy cells are made of a dielectric film having no spontaneous polarization characteristic; whereby when data is read out from an optional one of the unit cells on a selected one of the bit lines, a predetermined voltage outputted from that of dummy cells connected to the bit line pair including the selected bit line is provided pair as a reference voltage required for a comparison with a voltage corresponding to the read-out data.

In accordance with another aspect, the present invention provides a ferroelectric random access memory comprising a plurality of bit lines extending in one direction, a plurality of word lines extending in another direction perpendicular to the one direction, and a plurality of unit cells arranged in an M×N array while being connected to associated one of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; wherein the bit lines are grouped into bit line groups each consisting of N bit lines; further comprising: a dummy cell group consisting of a plurality of dummy cells each connected to one of bit lines included in an associated one of the bit line pairs at an optional position on the bit line, each of the dummy cells consisting of one transistor and one capacitor; a first switching transistor group consisting of a plurality of switching transistors each serving to switch a connection among the unit cells on one bit line included in an associated one of the bit line groups respectively corresponding to the dummy cells in response to a control signal externally applied thereto; a second switching transistor group consisting of a plurality of switching transistors each serving to switch a connection between the bit lines included in an associated one of the bit line groups respectively corresponding to the dummy cells in response to a control signal externally applied thereto; and a third switching transistor group consisting of a plurality of switching transistors each serving to erase data stored in an associated one of the dummy cells in response to a control signal externally applied thereto; wherein respective capacitors of the dummy cells are made of a dielectric film having no spontaneous polarization characteristic; whereby when data is read out from an optional one of the unit cells on a selected one of the bit lines, a predetermined voltage outputted from an inverted bit line neighboring to the bit line group including the selected bit line is provided as a reference voltage required for a comparison with a voltage corresponding to the read-out data.

In accordance with another aspect, the present invention provides a ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; further comprising: a dummy cell group divided into a first dummy cell group consisting of a plurality of dummy cells connected in common to a first dummy word line, and a second dummy cell group consisting of a plurality of dummy cells connected in common to a second dummy word line, each of the dummy cells consisting of one transistor and one capacitor; and a switching transistor group consisting of a plurality of switching transistors each serving to erase data stored in an associated one of the dummy cells in response to a control signal externally applied thereto; wherein respective capacitors of the dummy cells are made of a dielectric film having no spontaneous polarization characteristic; whereby when data is read out from an optional one of the unit cells on a selected one of the bit lines, a predetermined voltage outputted from that of dummy cells connected to an inverted bit line neighboring to the selected bit line is provided as a reference voltage required for a comparison with a voltage corresponding to the read-out data.

In accordance with another aspect, the present invention provides a ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines while being connected to a plurality of word lines, respectively, in such a fashion that they are arranged in an aligned fashion in a column direction, those of the bit lines connected to each of the bit lines being connected together in series; further comprising: a dummy cell connected to a dummy bit line and adapted to provide, to a selected one of the bit lines, a reference voltage required for a data determination when data is read out, the dummy cell consisting of one transistor and one capacitor; and a switching transistor serving to erase data stored in the dummy cell in response to a control signal externally applied thereto; wherein the capacitor of the dummy cell is made of a dielectric film having no spontaneous polarization characteristic; whereby when data is read out from an optional one of the unit cells on a selected one of the bit lines, a predetermined voltage outputted from the dummy cell connected to the dummy bit line is provided as a reference voltage required for a comparison with a voltage corresponding to the read-out data.

The unit cells connected in common to a single word line may be configured to be connected in common to a single plate electrode line. Alternatively, respective plate electrodes of the unit cells may be connected in common to a single plate electrode to which a predetermined voltage is applied.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Figure 1:
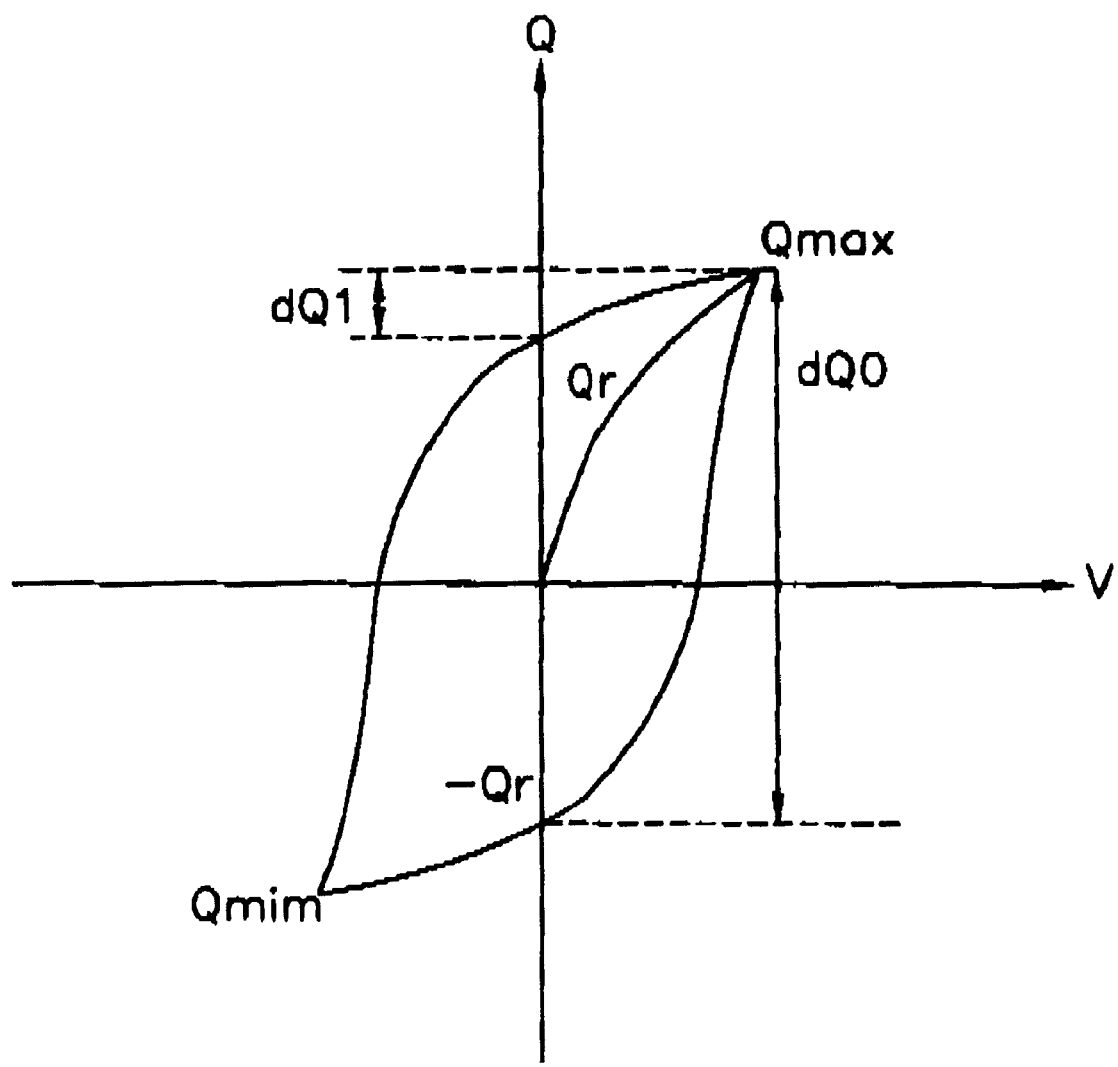
FIG. 1 is a hysteretic characteristic diagram illustrating polarization characteristics of a ferroelectric film.

The important technical idea of the present invention is to provide the present invention provides an FeRAM which includes M×N unit cells, each unit cell having a 1T/1C structure consisting of one transistor and one capacitor, dummy cells provided for respective bit lines and adapted to generate a reference voltage required for a data determination, and switching transistors respectively corresponding to the dummy cells. Alternatively, a single dummy cell is used which is connected to a separate dummy bit line. In accordance with the ON/OFF control of the switching transistors corresponding to a selected dummy cell, this selected dummy cell is used only when data is read out from an associated unit cell. By virtue of such technical means, it is possible to minimize the number of times using dummy cells for a generation of the reference voltage, thereby effectively preventing the number of times repeatedly using the FeRAM from being reduced, and to achieve a high integration of the FeRAM. Thus, the objects of the present invention can be easily accomplished.

Alternatively, a single plate electrode is used in common for memory cells, in place of plate electrode lines separated from one another in a row or column direction. By virtue of this configuration, it is possible to accomplish the object of the present invention for achieving an increase in capacitance within a given area.

Alternatively, the FeRAM has a configuration in which only one dummy cell and one switching transistor are connected to a dummy bit line. By virtue of such a configuration, it is possible to achieve a high integration of the memory while preventing the number of times repeatedly using the memory from being reduced.

Meanwhile, the FeRAM uses a capacitor having a ferroelectric film for each unit cell while using a typical dielectric film having no spontaneous polarization characteristic while exhibiting a superior resistance to a fatigue degradation over ferroelectric films having spontaneous polarization characteristics, for the capacitors of dummy cells. Accordingly, the dummy cells in the FeRAM of the present invention exhibit an enhanced reliability.

For the FeRAM according to the present invention, it is desirable to set the capacitance of each dummy cell in such a fashion that it substantially corresponds to the capacitance of a ferroelectric exhibited in a residual polarization state. In particular, when the data stored in a unit cell selected for a data read procedure is "1", the potential variation dV1 on the bit line connected to the unit cell corresponds to "dQ1/(Cb+Cs)" (dV1=dQ1/(Cb+Cs)). On the other hand, the data stored in the unit cell is "0", the potential variation dV0 on the bit line corresponds to "dQ0/(Cb+Cs)" (dV0=dQ0/(Cb+Cs)). Therefore, the potential variation on an inverted bit line associated with the bit line corresponds to "Qr/(Cb+Cs)", which is approximately intermediate between "dV1" and "dV0", by virtue of the capacitor of a dummy cell connected to the inverted bit line.

Now, preferred embodiments of the present invention will be described in detail, in conjunction with the annexed drawings.

{First Embodiment}

Figure 2A:
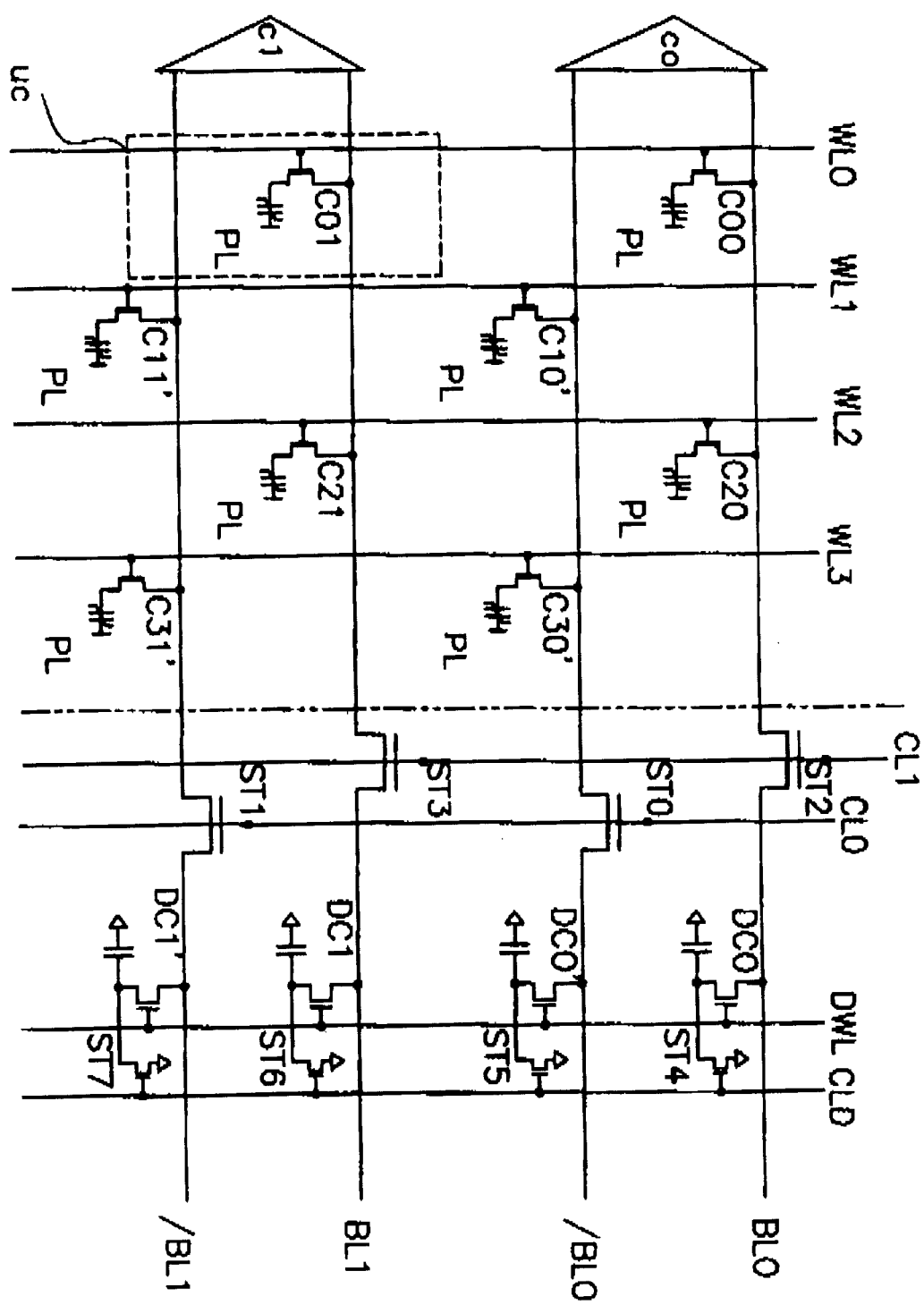
FIG. 2a is an equivalent circuit diagram illustrating a part of an FeRAM in accordance with a first embodiment of the present invention.

FIG. 2a is an equivalent circuit diagram illustrating a part of an FeRAM in accordance with first embodiment of the present invention.

Referring to FIG. 2a, the FeRAM according to this embodiment includes M×N unit cells arranged in rows and columns in an interlaced fashion, like the black or white pattern of a chess plate. A plurality of unit cells arranged in the same row are connected together in series by one of bit lines arranged in pair. The bit lines of each bit line pair operate alternatingly in such a fashion that when data is read out on one bit line, the other bit line serves as an inverted bit line providing a reference voltage.

The FeRAM according to this embodiment extends in a row direction in such a fashion that a plurality of unit cells are arranged in an M×N matrix array in which a plurality of word lines WL0 to WL3 each connected to a plurality of unit cells arranged in the same column cross a plurality of bit lines arranged in pair. Each bit line pair consists of one bit line and one inverted bit line. In FIG. 2a, "BL0" and "BL1" denote the bit lines of one bit line pair, and "/BL0" and "/BL1" denote the bit lines of another bit line pair. Respective plate electrodes of the unit cells are connected in common, so that a constant voltage is applied to them.

Although the plate electrodes of the unit cells in this embodiment are illustrated as being connected in common by a single plate electrode PL so that a constant voltage is applied to them, plate electrode lines separated in a column or row direction may be used in order to selectively apply a high voltage "Vcc" or a low voltage "0 V" to the plate electrode of each unit cell in accordance with data to be stored in that unit cell.

In particular, in the FeRAM according to this embodiment, each unit cell denoted by the reference character UC has a 1T/1C structure consisting of one transistor (a charge transfer transistor) and one capacitor. A dummy cell DC0, DC0', DC1, or DC1', which consists of one transistor (a charge transfer transistor) and one capacitor, is coupled to an associated one of the bit lines BL0, BL0', BL1, and BL1' at one side of the associated bit line (the right side of FIG. 2a).

The transistor of each unit cell UC is coupled at a gate thereof to an associated one of the word lines WL0, WL1, WL2, and WL3, at a drain (or a source) thereof to an associated one of the bit lines BL0, BL0', BL1, and BL1', and at a source (a drain) thereof to one end of the capacitor included in the unit cell UC. The other end of the capacitor is connected to a single plate electrode line PL to which respective other ends of the capacitors in the remaining unit cells are connected in common.

The transistors of the dummy cells DC0, DC0', DC1, and DC1' are coupled in common at their gates to a dummy word line DWL, and coupled at their drains (or sources) to the bit lines BL0, BL0', BL1, and BL1', respectively. The transistor of each dummy cell DC0, DC0', DC1, or DC1' is also coupled at its source (or its drain) to one end of the capacitor included in the dummy cell. Respective other ends of the capacitors in the dummy cells are connected in common.

A switching transistor is arranged on each bit line between the portion of the bit line, to which unit cells are coupled, and the portion of the bit line, to which an associated one of the dummy cells are coupled. In the illustrated case, a switching transistor ST0 is arranged on the bit line /BL0 between the portion of the bit line /BL0, to which the unit cells C10' and C30' are coupled, and the portion of the bit line /BL0, to which the dummy cell DC0' is coupled. A switching transistor ST1 is arranged on the bit line /BL1 between the portion of the bit line /BL1, to which the unit cells C11' and C31' are coupled, and the portion of the bit line /BL1, to which the dummy cell DC1' is coupled. A switching transistor ST2 is arranged on the bit line BL0 between the portion of the bit line BL0, to which the unit cells C00 and C20 are coupled, and the portion of the bit line BL0, to which the dummy cell DC0 is coupled. A switching transistor ST3 is arranged on the bit line BL1 between the portion of the bit line BL1, to which the unit cells C01 and C21 are coupled, and the portion of the bit line BL1 to which the dummy cell DC1 is coupled.

The switching transistors ST0 and ST1 are coupled in common at their gates to a control line CL0. The switching transistors ST2 and ST3 are coupled in common at their gates to a control line CL1. When data is to be stored or read out, a switching control signal from an external unit is applied to respective gates of the switching transistors ST0 to ST3.

Switching transistors ST4 to ST7 are coupled at their output terminals to respective transistors of the dummy cells DC0, DC0', DC1, and DC1'. When data is read out, the switching transistors ST0 to ST3 are turned on or off in response to a switching control signal applied thereto via a control line CLD, to which the switching transistors ST0 to ST3 are connected in common, in order to clear data stored in the associated dummy cells, respectively.

As apparent from the above description, in the FeRAM according to this embodiment, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In accordance with this configuration, data read out from an optional unit cell is determined by applying, to a comparator C0 or C1, a voltage outputted from a bit line, on which the data from that unit cell is read out, along with a reference voltage outputted from bit lines neighboring to that bit line while having a potential inverse to the potential of the bit line, thereby comparing the applied voltages. The dummy cells DC0, DC0', DC1, and DC1' connected to respective bit lines are used only when data is read out from the associated unit cells, respectively.

The procedures for storing data in the FeRAM having the above mentioned configuration according to this embodiment and reading out the stored data will be described in detail.

For the convenience and best understanding of description, it is assumed in the following description that an application of a high voltage to the bit line means the fact that the applied voltage is higher than the potential of the plate electrode whereas an application of a low voltage to the bit line means the fact that the applied voltage is lower than the potential of the plate electrode. Also, it is assumed that the potential variation of a bit line when output data is "1" corresponds to "V1", and the potential variation of the bit line when output data is "0" corresponds to "V0". Since the same data storing and reading procedures are carried out in all unit cells, these procedures will be described only in conjunction with the unit cells C00 and C10'.

First, the procedure for storing data "1" in the unit cell C00 will be described. In order to store data, the dummy word line DWL and two control lines CL0 and CL1 are switched to their OFF states, respectively. Also, the word line WL0 is switched to its ON state. In this state, a high voltage is applied to the bit line BL0. Due to a potential difference resulting from such a voltage application, the ferroelectric film included in the unit cell C00 is polarized in a plus (+) direction. Accordingly, data "1" is stored.

Where it is desired to stored data "1" in the unit cell C10', the word line WL1 is switched to its ON state under the condition in which the control lines CL0 and CL1 and dummy word line DLW are switched to their OFF states, respectively. When a high voltage is applied to the bit line /BL0 in this state, the ferroelectric film included in the unit cell C10' is polarized in a plus (+) direction due to a potential difference resulting from the above mentioned voltage application. Accordingly, data "1" is stored.

Now, the procedure for storing data "0" in the unit cell C00 will be described. In order to store data, the dummy word line DWL and two control lines CL0 and CL1 are switched to their OFF states, respectively. Also, the word line WL0 is switched to its ON state. In this state, a low voltage is applied to the bit line BL0. Due to a potential difference resulting from such a voltage application, the ferroelectric film included in the unit cell C00 is polarized in a minus (−) direction. Accordingly, data "0" is stored.

Where it is desired to store data "0" in the unit cell C10', the word line WL1 is switched to its ON state under the condition in which the control lines CL0 and CL1 and dummy word line DWL are switched to their OFF states, respectively. When a high voltage is applied to the bit line /BL0 in this state, the ferroelectric film included in the unit cell C10' is polarized in a minus (−) direction due to a potential difference resulting from the above mentioned voltage application. Accordingly, data "0" is stored.

As apparent from the above description, in the FeRAM according to this embodiment, data "1" or data "0" is stored in respective unit cells C00 and C10' connected to the bit lines BL0 and /BL0 in accordance with voltages (a high voltage or a low voltage) applied to those bit lines in accordance with the above mentioned memory control procedures.

Although the control lines CL0 and CL1 and dummy word line DWL have been described as being switched to their OFF states in the data storing procedure according to this embodiment, they are not limited to such a condition. It is possible to obtain the same result even when the control lines and dummy word line have a condition different from the above mentioned condition, that is, they are switched to their ON states.

As apparent from the above description, in the FeRAM according to this embodiment, no dummy cell is used in the procedure for storing data in an optical unit cell. Accordingly, it is possible to considerably reduce the number of times using dummy cells. As a result, the number of times repeatedly using the FeRAM is relatively increased.

The procedure for reading out data "1" or "0" stored in the unit cells C00 and C10' in accordance with the above mentioned procedure will now be described.

First, the procedure for reading out data stored in the unit cell C00 will be described. In this procedure, the control line CLD is first switched to its ON state so as to erase data stored in the dummy cells. After the data erasure, the control line CLD is switched again to its OFF state. The control line CL1 is subsequently switched to its OFF state. Also, the control line CL0 is switched to its ON state. In this state, a high voltage is applied to two bit lines BL0 and /BL0. Also, the word line WL0 and dummy word line DWL are switched to their ON states, respectively. In this state, a potential variation of "V1" or "V0" occurs on the bit line BL0 in accordance with the data stored in the unit cell C00. That is, where data "1" is stored in the unit cell C00, the potential variation of the bit line BL0 corresponds to "V1". On the other hand, where data "0" is stored in the unit cell C00, the potential variation of the bit line BL0 corresponds to "V0".

At this time, the potential variation occurring on the inverted bit line /BL0 corresponds to a value approximately intermediate between "dV1" and "dV0" by virtue of the capacitor of the dummy cell DC0'. This potential variation is used as a reference voltage for a determination of data read out from the unit cell C00.

That is, the voltage on the bit line BL0 and the reference voltage on the inverted bit line /BL0 are transmitted to the comparator C0 which, in turn, determines the read-out data, based on the received voltages. When the voltage outputted from the bit line BL0 is higher than the reference voltage outputted from the inverted bit line /BL0, the data read out from the unit cell C00 is determined to be data "1". On the other hand, when the voltage outputted from the bit line BL0 is not higher than the reference voltage outputted from the inverted bit line /BL0, the data read out from the unit cell C00 is determined to be data "0".

In the procedure for reading out data stored in the unit cell C10', the control line CLD is first switched to its ON state so as to erase data stored in the dummy cells. After the data erasure, the control line CLD is switched again to its OFF state. The control line CL0 is subsequently switched to its OFF state. Also, the control line CL1 is switched to its ON state. In this state, a high voltage is applied to two bit lines BL0 and /BL0. Also, the word line WL1 and dummy word line DWL are switched to their ON states, respectively. In this state, a potential variation of "V1" or "V0" occurs on the inverted bit line /BL0 in accordance with the data stored in the unit cell C10'. That is, where data "1" is stored in the unit cell C10', the potential variation of the bit line /BL0 corresponds to "V1". On the other hand, where data "0" is stored in the unit cell C10', the potential variation of the bit line /BL0 corresponds to "V0".

At this time, the potential variation occurring on the inverted bit line BL0 corresponds to a value approximately intermediate between "dV1" and "dV0" by virtue of the capacitor of the dummy cell DC0. This potential variation is used as a reference voltage for a determination of data read out from the unit cell C10'.

That is, the voltage on the bit line /BL0 and the reference voltage on the inverted bit line BL0 are transmitted to the comparator C0 which, in turn, determines the read-out data, based on the received voltages. When the voltage outputted from the bit line /BL0 is higher than the reference voltage outputted from the inverted bit line BL0, the data read out from the unit cell C10' is determined to be data "1". On the other hand, when the voltage outputted from the bit line /BL0 is not higher than the reference voltage outputted from the inverted bit line BL0, the data read out from the unit cell C10' is determined to be data "0".

Thus, the FeRAM according to this embodiment uses no dummy cell in the procedure for storing data an optional unit cell while using a dummy cell in the procedure for reading out data from an optional unit cell.

As apparent from the above description, in an FeRAM according to this embodiment, which consists of M×N unit cells, each unit cell having A 1T/1C structure consisting of one transistor and one capacitor. In order to generate a reference voltage for a determination of data read out on a bit line in the FeRAM, a dummy cells is used, which is connected to a bit line (or an inverted bit line) neighboring to that bit line. A switching transistor is also provided which serves to erase data stored in an associated one of dummy cells connected to bit lines (or inverted bit lines) in response to a switching control signal applied thererto via a dummy word line. The FeRAM is also configured to use no dummy cell in the procedure for storing data an optional unit cell while using a desired dummy cell in the procedure for reading out data from an optional unit cell. Accordingly, it is possible to effectively prevent the number of times repeatedly using the FeRAM from being reduced, and to achieve a high integration of the FeRAM.

Alternatively, a single plate electrode is used in common for memory cells, in place of separate plate electrode lines. By virtue of such a configuration, it is possible to achieve an increase in capacitance within a given area.

Although the capacitors of the dummy cells in the FeRAM according to this embodiment may be formed using a separate capacitor fabrication process, it is more desirable to use gate capacitors which use a gate insulating film as a dielectric film thereof. In this case, no separate process is required in the formation of the dummy cell capacitors.

Figure 2B:
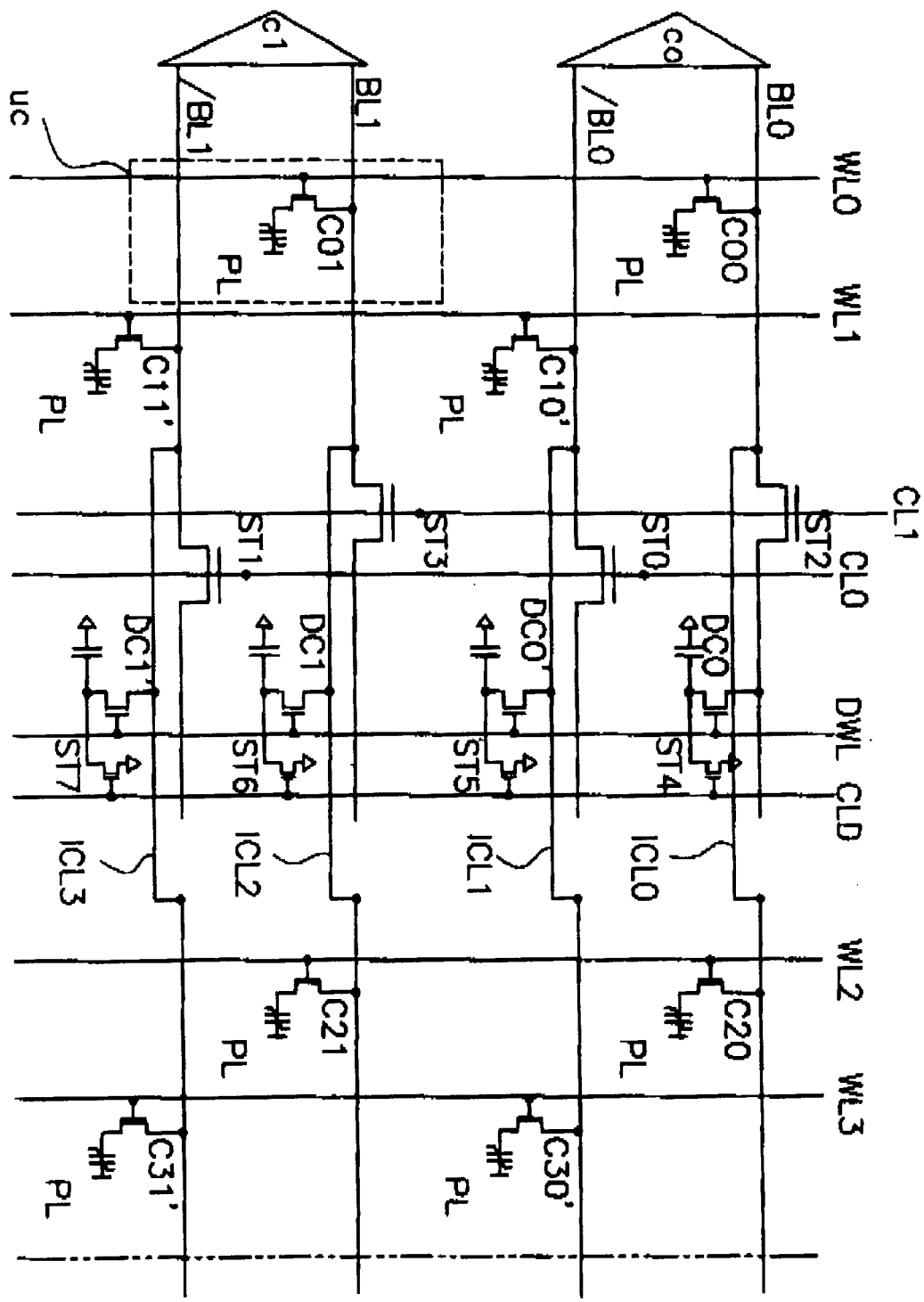
FIG. 2b is an equivalent circuit diagram illustrating a part of an FeRAM according to a first modified embodiment from the first embodiment of the present invention.

FIG. 2b is an equivalent circuit diagram illustrating a part of an FeRAM according to a first modified embodiment from the first embodiment of the present invention.

Referring to FIG. 2b, this first modified embodiment has the same configuration and arrangement as those of the first embodiment, except that the dummy cells DC0, DC0', DC1, and DC1' and switching transistors ST0 to ST7 are arranged at optional positions between unit cells neighboring to each other in a row direction, respectively. For such an arrangement, each bit line, on which a plurality of unit cells are connected, is divided into two separate portions. One dummy cell and one switching transistor are connected to one of the separate bit line portions. The separate bit line portions of each bit line are connected to each other by an interconnection line TCL0, /ICL0, ICL1, and /ICL1.

In the FeRAM according to the first modified embodiment, the procedures for inputting data to an optional unit cell, and reading out data stored in the optional unit cell are the same as those in the first embodiment. Accordingly, no further description will be made in conjunction with those procedures.

This first modified embodiment illustrates the fact that the dummy cells may be arranged at optional positions between unit cells neighboring to each other in a row direction, respectively.

Although the FeRAM according to the first modified embodiment has slightly different configurations from those of the first embodiment in that the dummy cells are arranged at optional positions between unit cells neighboring to each other in a row direction, respectively, the same effect as that of the first embodiment can be obtained by dividing each bit line into two separate portions, and appropriately connecting the separate bit line portions by an interconnection line.

Figure 2C:
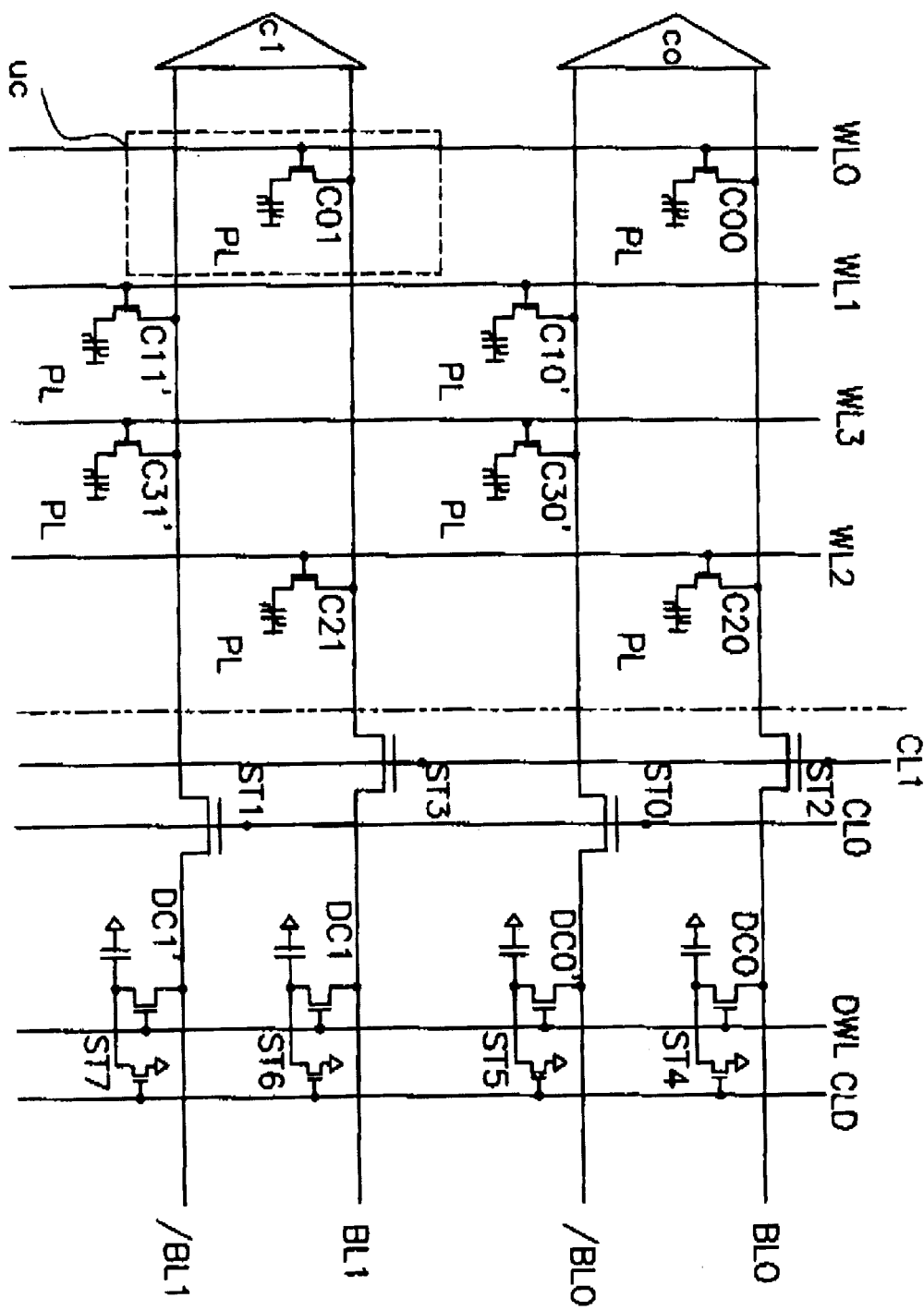
FIG. 2c is an equivalent circuit diagram illustrating a part of an FeRAM according to a second modified embodiment from the first embodiment of the present invention.

FIG. 2c is an equivalent circuit diagram illustrating a part of an FeRAM according to a second modified embodiment from the first embodiment of the present invention.

Figure 3A:
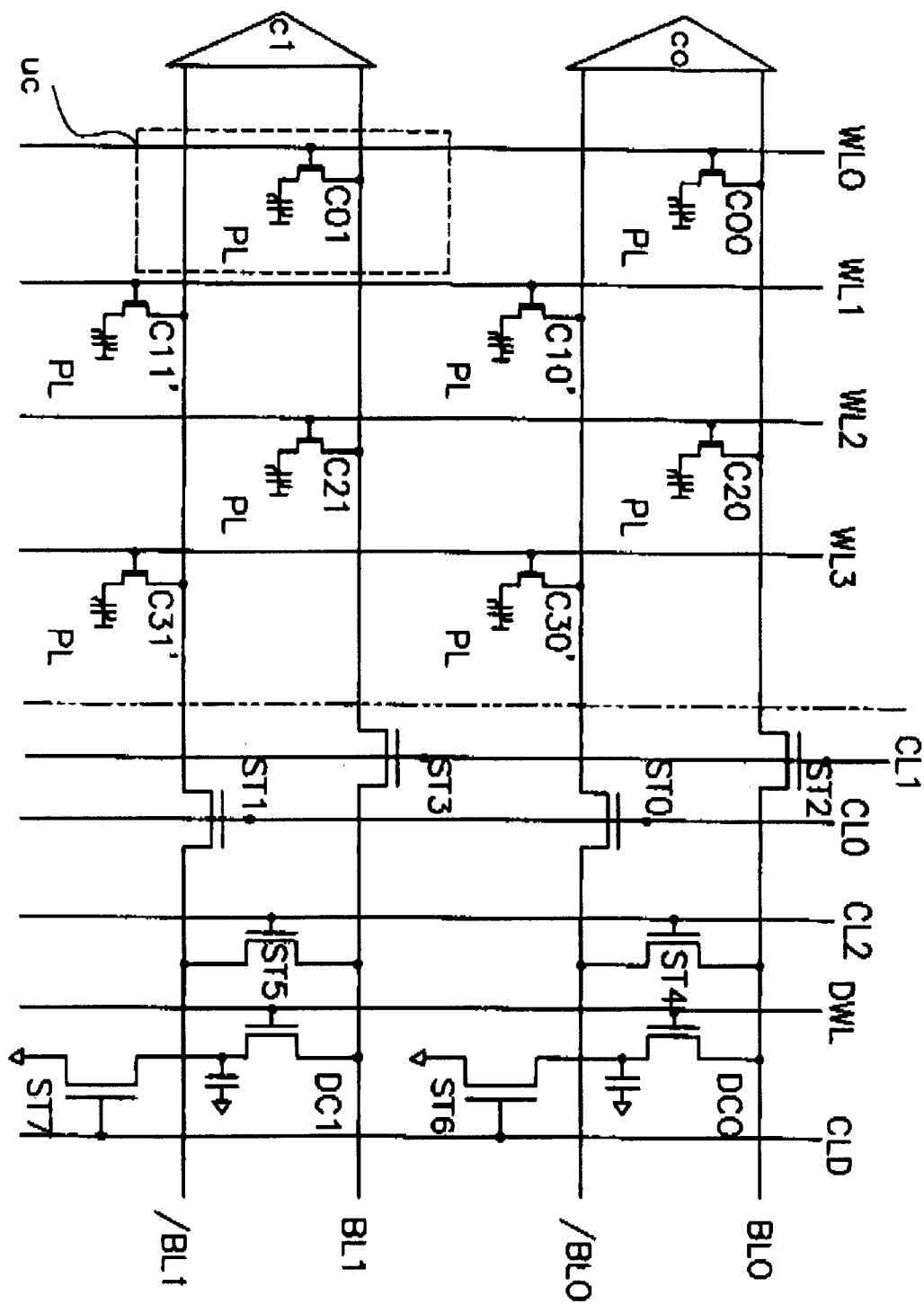
FIG. 3a is an equivalent circuit diagram illustrating a part of an FeRAM in accordance with a second embodiment of the present invention.
Figure 3B:
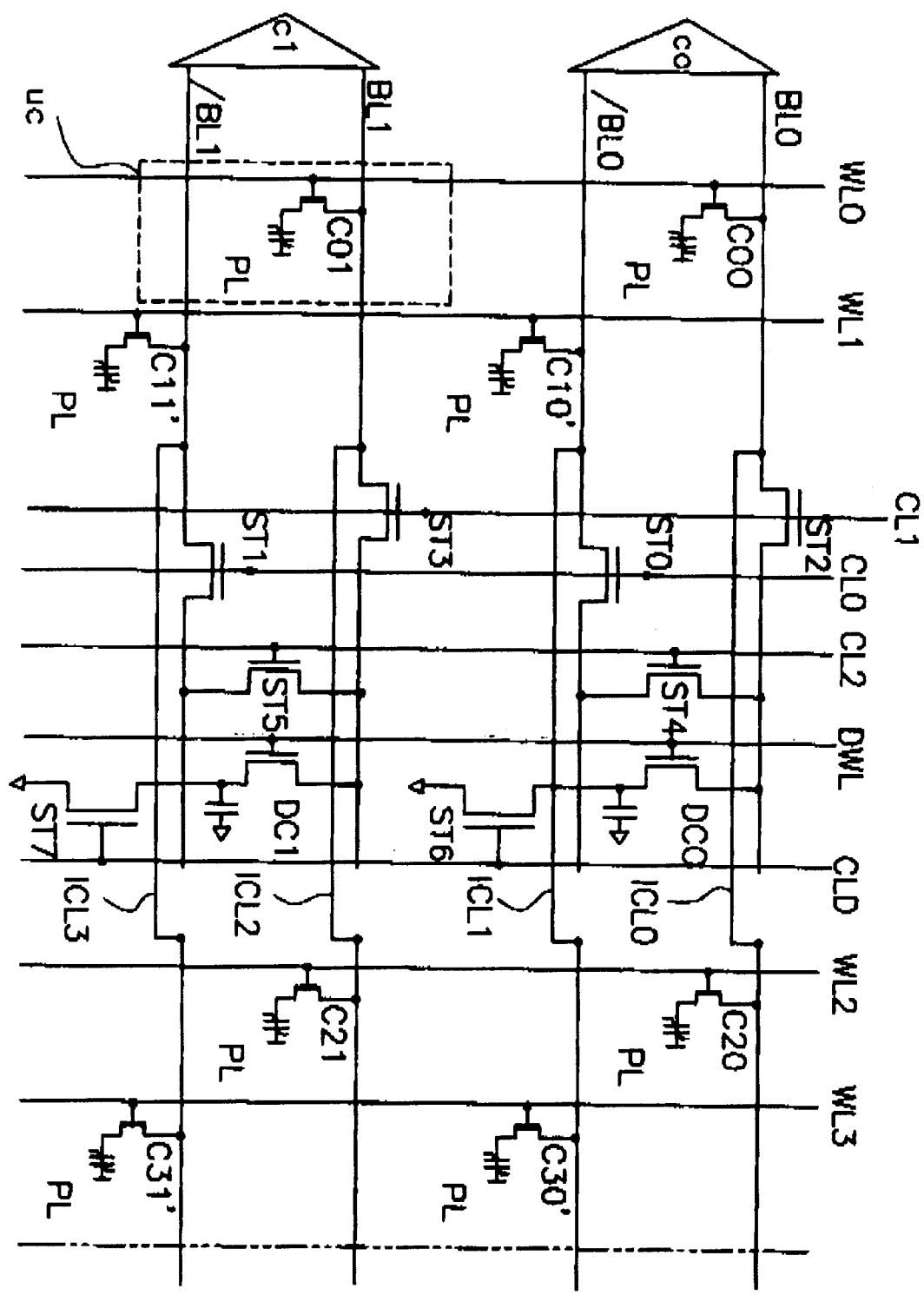
FIG. 3b is an equivalent circuit diagram illustrating a part of an FeRAM according to a first modified embodiment from the second embodiment of the present invention.
Figure 3C:
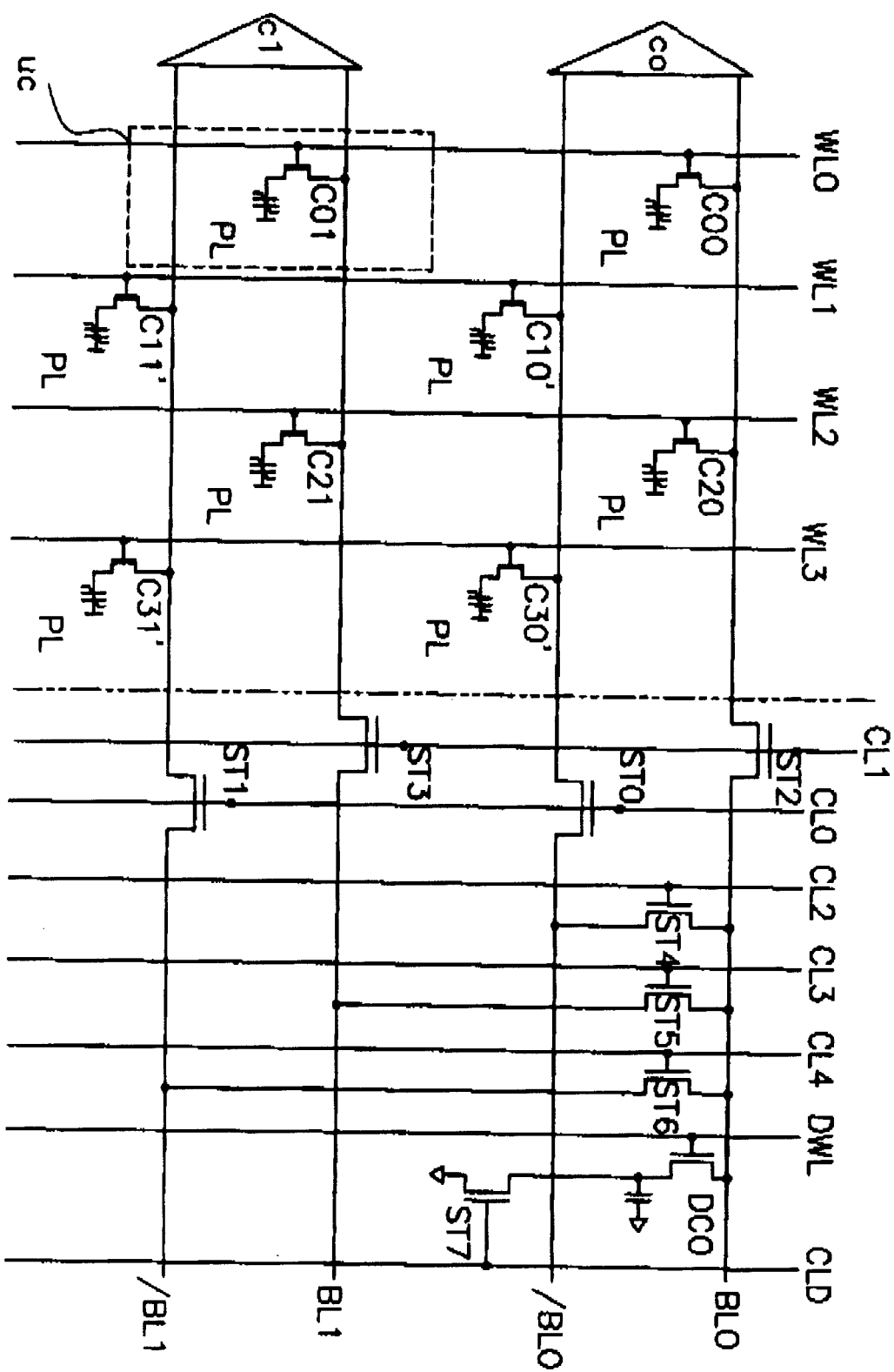
FIG. 3c is an equivalent circuit diagram illustrating a part of an FeRAM according to a second modified embodiment from the second embodiment of the present invention.

Referring to FIG. 3c, this second modified embodiment has the same configuration and arrangement as those of the first embodiment, except that the unit cells of the same row connected in series on each of bit lines BL0, /BL0, BL1, and /BL1 are arranged in pair.

In the FeRAM according to this second modified embodiment, the procedures for inputting data "1" or "0" to an optional unit cell, and reading out data stored in the optional unit cell are the same as those in the second embodiment. Accordingly, no further description will be made in conjunction with those procedures, in order to avoid an unnecessarily repeated description.

Although the FeRAM according to the second modified embodiment has slightly different configurations from those of the first embodiment in that the unit cells of the same row connected in series on each bit line are arranged in pair, the same effect as that of the first embodiment can be obtained.

{Second Embodiment}

FIG. 3a is an equivalent circuit diagram illustrating a part of an FeRAM in accordance with a second embodiment of the present invention.

Referring to FIG. 3a, the FeRAM according to this embodiment is substantially identical to the first embodiment in terms of the arrangements of diverse lines including bit lines, word lines, dummy word line, and control lines, and unit cells, dummy cells, and switching transistors arranged in an interconnected fashion by those lines. However, the FeRAM according to this embodiment is different from the first embodiment in terms of the configurations and arrangements of dummy cells and switching transistors.

That is, the FeRAM of this embodiment has a configuration in which one dummy cell and four switching transistors are provided for one bit line pair consisting of one bit line and one inverted bit line, as compared to the FeRAM of the first embodiment in which one dummy cell and two switching transistors are provided for one bit line.

As shown in FIG. 3a, switching transistors ST0 to ST3 are arranged on the bit lines BL0, /BL0, BL1, and /BL1, respectively. Those of the switching transistors ST0 to ST3 arranged in an interlaced fashion in a column direction are coupled in common at gates thereof to a control line CL0 or CL1. Switching transistors ST4 and ST5 are also connected in common at gates thereof to a control line CL2. Each of the switching transistors ST4 and ST5 serves to connect together the bit lines of each bit line pair, serving as complementary bit lines, that is, a bit line and an inverted bit line. Dummy cells DC0 and DC1, which are connected at gates thereof in common to a dummy word line DWL, are provided for respective bit line pairs. Each dummy cell is connected to one of the bit lines included in the associated bit line pair. Switching transistors ST6 and ST7 are also provided which are connected at gates thereof in common to a control line CLD. Each of the switching transistors ST6 and ST7 is connected between one end of an associated one of the dummy cells DC0 and DC1 and the ground.

In order to avoid an unnecessarily repeated description for the second embodiment, no description will be made in conjunction with the whole arrangement of the FeRAM according to this embodiment. In the following description, only the procedure for storing data in the FeRAM according to this embodiment using the common plate electrode line, and reading out the stored data will be described.

For the convenience and best understanding of description, it is assumed in the following description that an application of a high voltage to the bit line means the fact that the applied voltage is higher than the potential of the plate electrode whereas an application of a low voltage to the bit line means the fact that the applied voltage is lower than the potential of the plate electrode. Also, it is assumed that the potential variation of a bit line when output data is "1" corresponds to "V1", and the potential variation of the bit line when output data is "0" corresponds to "V0".

Since the same data storing and reading procedures are carried out in the all unit cells, these procedures will be described only in conjunction with the unit cells C00 and C10'.

Furthermore, the procedures for storing data in respective unit cells C00 and C10' are the same as those in the first embodiment. In the following description, accordingly, only the procedures for reading out data stored in respective unit cells C00 and C10' will be described in order to avoid an unnecessarily repeated description.

First, the procedure for reading out data stored in the unit cell C00 will be described. In this procedure, the control line CLD is first switched to its ON state so as to erase data stored in the dummy cells. After the data erasure, the control line CLD is switched again to its OFF state. The control line CL1 is subsequently switched to its OFF state. Also, the control lines CL0 and CL2 are switched to their ON states. In this state, a high voltage is applied to two bit lines BL0 and /BL0. Also, the word line WL0 and dummy word line DWL are switched to their ON states, respectively. In this state, a potential variation of "V1" or "V0" occurs on the bit line BL0 in accordance with the data stored in the unit cell C00. That is, where data "1" is stored in the unit cell C00, the potential variation of the bit line BL0 corresponds to "V1". On the other hand, where data "0" is stored in the unit cell C00, the potential variation of the bit line BL0 corresponds to "V0".

At this time, the potential variation occurring on the inverted bit line /BL0 corresponds to a value approximately intermediate between "dV1" and "dV0" by virtue of the capacitor of the dummy cell DC0'. This potential variation is used as a reference voltage for a determination of data read out from the unit cell C00.

That is, the voltage on the bit line BL0 and the reference voltage on the inverted bit line /BL0 are transmitted to the comparator C0 which, in turn, determines the read-out data, based on the received voltages. When the voltage outputted from the bit line BL0 is higher than the reference voltage outputted from the inverted bit line /BL0, the data read out from the unit cell C00 is determined to be data "1". On the other hand, when the voltage outputted from the bit line BL0 is not higher than the reference voltage outputted from the inverted bit line /BL0, the data read out from the unit cell C00 is determined to be data "0".

In the procedure for reading out data stored in the unit cell C10', the control line CLD is first switched to its ON state so as to erase data stored in the dummy cells. After the data erasure, the control line CLD is switched again to its OFF state. The control line CL0 is subsequently switched to its OFF state. Also, the control line CL1 is switched to its ON state. In this state, a high voltage is applied to two bit lines BL0 and /BL0. Also, the word line WL1 and dummy word line DWL are switched to their ON states, respectively. In this state, a potential variation of "V1" or "V0" occurs on the inverted bit line /BL0 in accordance with the data stored in the unit cell C10'. That is, where data "1" is stored in the unit cell C10', the potential variation of the bit line /BL0 corresponds to "V1". On the other hand, where data "0" is stored in the unit cell C10', the potential variation of the bit line /BL0 corresponds to "V0".

At this time, the potential variation occurring on the inverted bit line BL0 corresponds to a value approximately intermediate between "dV1" and "dV0" by virtue of the capacitor of the dummy cell DC0. This potential variation is used as a reference voltage for a determination of data read out from the unit cell C10'.

That is, the voltage on the bit line /BL0 and the reference voltage on the inverted bit line BL0 are transmitted to the comparator C0 which, in turn, determines the read-out data, based on the received voltages. When the voltage outputted from the bit line /BL0 is higher than the reference voltage outputted from the inverted bit line BL0, the data read out from the unit cell C10' is determined to be data "1". On the other hand, when the voltage outputted from the bit line /BL0 is not higher than the reference voltage outputted from the inverted bit line BL0, the data read out from the unit cell C10' is determined to be data "0".

Thus, the FeRAM according to this embodiment uses no dummy cell in the procedure for storing data an optional unit cell while using a dummy cell in the procedure for reading out data from an optional unit cell, as in the first embodiment.

As apparent from the above description, the FeRAM according to this embodiment uses no dummy cell in the procedure for storing data an optional unit cell. In the procedure for reading out data from an optional unit cell, a dummy cell is used which is connected to the inverted bit line associated with the unit cell. Accordingly, the same result as that of the first embodiment is obtained. That is, it is possible to effectively prevent the number of times repeatedly using the FeRAM from being reduced due to an excessive use of dummy cells, and to achieve a high integration of the FeRAM.

Alternatively, a single plate electrode is used in common for memory cells, in place of separate plate electrode lines. By virtue of such a configuration, it is possible to achieve an increase in capacitance within a given area.

In accordance with this embodiment, the capacitors of the dummy cells may be formed using a separate capacitor fabrication process. Alternatively, gate capacitors may be used which use a gate insulating film as a dielectric film thereof.

FIG. 3b is an equivalent circuit diagram illustrating a part of an FeRAM according to a first modified embodiment from the second embodiment of the present invention.

Referring to FIG. 3b, this first modified embodiment has the same configuration and arrangement as those of the second embodiment, except that the dummy cells DC0, DC0', DC1, and DC1' and switching transistors ST0 to ST7 are arranged at optional positions between unit cells neighboring to each other in a row direction, respectively. For such an arrangement, each bit line, on which a plurality of unit cells are connected, is divided into two separate portions. One dummy cell and one switching transistor are connected to one of the separate bit line portions. The separate bit line portions of each bit line are connected to each other by an interconnection line ICL0, /ICL0, ICL1, and /ICL1.

In the FeRAM according to the first modified embodiment, the procedures for inputting data to an optional unit cell, and reading out data stored in the optional unit cell are the same as those in the first embodiment. Accordingly, no further description will be made in conjunction with those procedures.

This first modified embodiment illustrates the fact that the dummy cells may be arranged at optional positions between unit cells neighboring to each other in a row direction, respectively.

Although the FeRAM according to the first modified embodiment has slightly different configurations from those of the second embodiment in that the dummy cells are arranged at optional positions between unit cells neighboring to each other in a row direction, respectively, the same effect as that of the first embodiment can be obtained by dividing each bit line into two separate portions, and appropriately connecting the separate bit line portions by an interconnection line.

FIG. 3c is an equivalent circuit diagram illustrating a part of an FeRAM according to a second modified embodiment from the second embodiment of the present invention.

Referring to FIG. 3c, this second modified embodiment has the same configuration and arrangement as those of the second embodiment, except that one dummy cell is provided for every four bit lines, as compared to the first embodiment in which one dummy cell is provided for every two bit lines. In order to avoid an unnecessarily repeated description for this second modified embodiment, therefore, a description will be made only in conjunction with the configuration of this embodiment different from the first modified one of the second embodiment.

As mentioned above, the FeRAM according to this second modified embodiment has a configuration in which one dummy cell is provided for every four bit lines. For this configuration, the FeRAM includes switching transistors ST0 to ST3 respectively arranged on the bit lines BL0, /BL0, BL1, and /BL1. Those of the switching transistors ST0 to ST3 arranged in an interlaced fashion in a column direction are coupled in common at gates thereof to a control line CL0 or CL1. The FeRAM also includes a switching transistor ST4 connected at a gate thereof to a control line CL2 and adapted to connect a reference bit line, for example, "BL0", with the bit line /BL0 neighboring to the reference bit line BL0, a switching transistor ST5 connected at a gate thereof to a control line CL3 and adapted to connect the reference bit line BL0 with the bit line BL1 neighboring to the reference bit line BL0 while being spaced from the reference bit line BL0 by one row, and a switching transistor ST6 connected at a gate thereof to a control line CL4 and adapted to connect the reference bit line BL0 with the bit line /BL1 neighboring to the reference bit line BL0 while being spaced from the reference bit line BL0 by two rows.

In the FeRAM according to the second modified embodiment, the procedures for inputting data to an optional unit cell, and reading out data stored in the optional unit cell are the same as those in the second embodiment. Accordingly, no further description will be made in conjunction with those procedures.

This second modified embodiment illustrates the fact that one dummy cell may be provided for every desired number of bit lines.

Although the FeRAM according to the second modified embodiment has slightly different configurations from those of the second embodiment in that one dummy cell is provided for every four bit lines, the same effect as that of the first embodiment can be obtained.

Figure 3D:
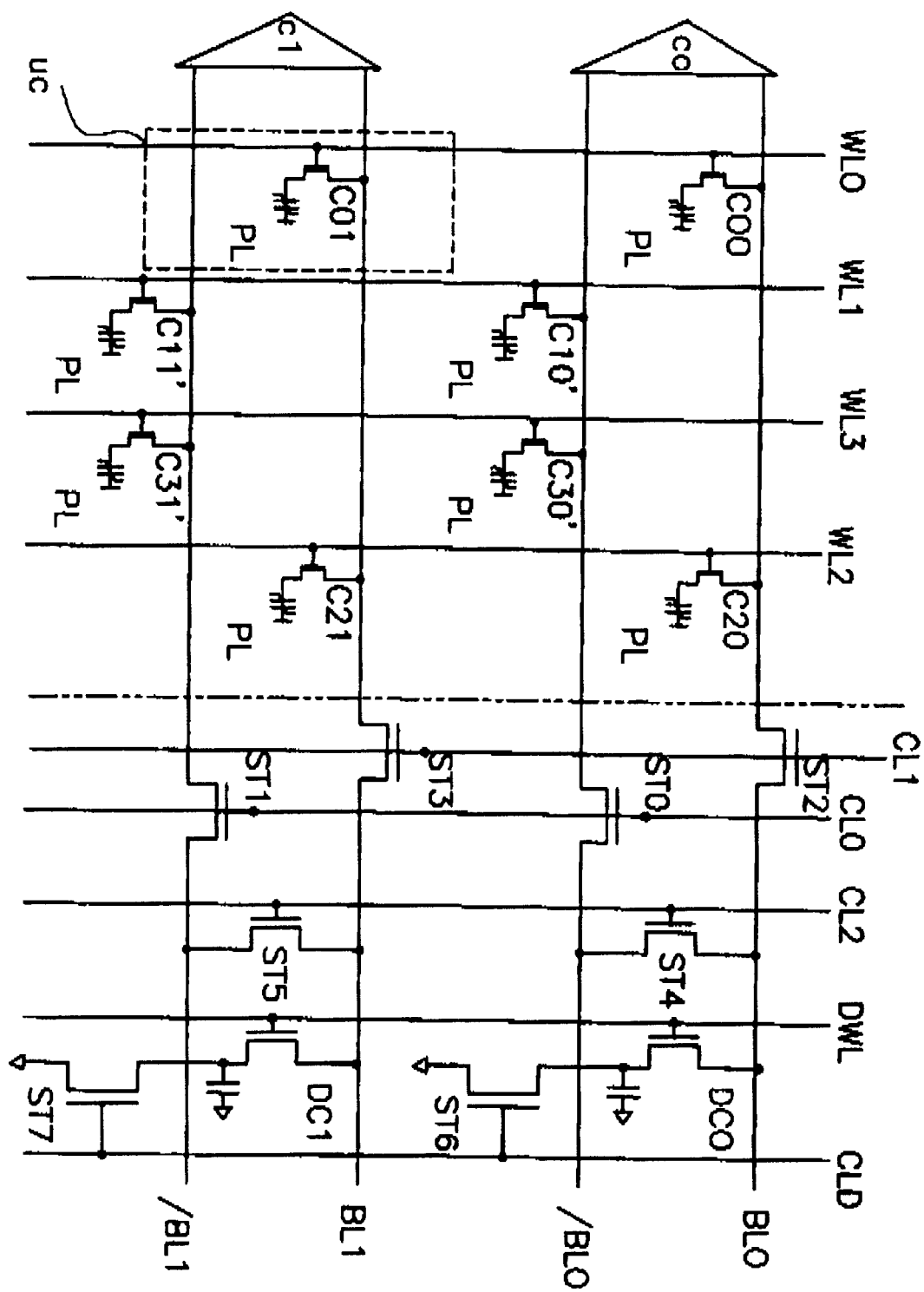
FIG. 3d is an equivalent circuit diagram illustrating a part of an FeRAM according to a second modified embodiment from the third embodiment of the present invention.

FIG. 3d is an equivalent circuit diagram illustrating a part of an FeRAM according to a third modified embodiment from the second embodiment of the present invention.

Referring to FIG. 3d, this third modified embodiment has the same configuration and arrangement as those of the second embodiment, except that the unit cells of the same row connected in series on each of bit lines BL0, /BL0, BL1, and /BL1 are arranged in pair.

In the FeRAM according to this third modified embodiment, the procedures for inputting data "1" or "0" to an optional unit cell, and reading out data stored in the optional unit cell are the same as those in the second embodiment. Accordingly, no further description will be made in conjunction with those procedures, in order to avoid an unnecessarily repeated description.

Although the FeRAM according to the third modified embodiment has slightly different configurations from those of the first embodiment in that the unit cells of the same row connected in series on each bit line are arranged in pair, the same effect as that of the second embodiment can be obtained.

[Third Embodiment]

Figure 4A:
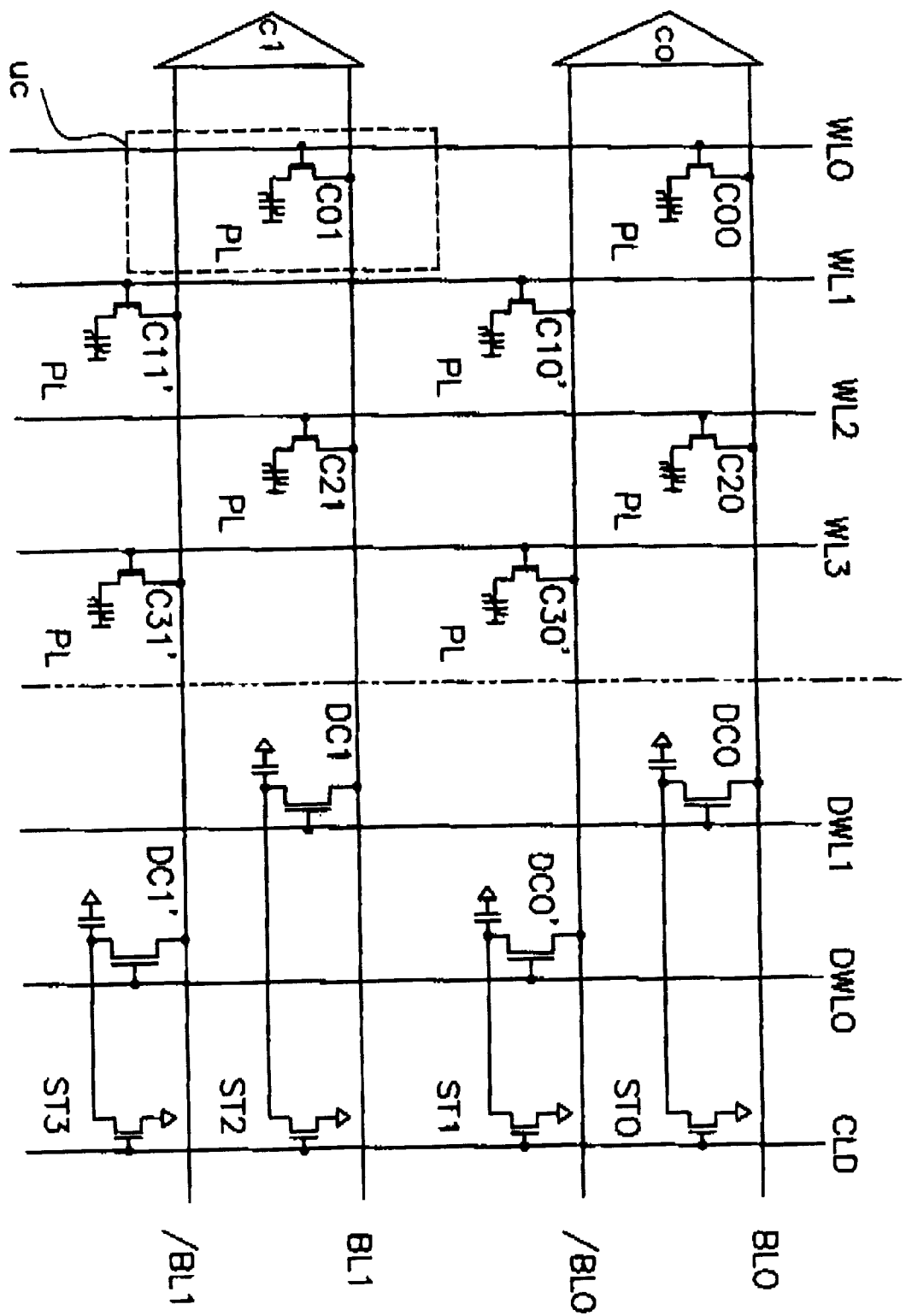
FIG. 4a is an equivalent circuit diagram illustrating a part of an FeRAM in accordance with a third embodiment of the present invention.

FIG. 4a is an equivalent circuit diagram illustrating a part of an FeRAM in accordance with a third embodiment of the present invention.

Referring to FIG. 4a, the FeRAM according to this embodiment is identical to the above mentioned first embodiment of the present invention, in terms of the arrangements of diverse lines including bit lines, word lines, dummy word line, and control lines, and the arrangement in which switching transistors ST0 to ST3 are connected to respective dummy cells connected to bit lines BL0, /BL0, BL1, and /BL1.

However, the FeRAM according to this embodiment is different from the first embodiment in terms of the configurations and arrangements of dummy cells and switching transistors. That is, in this embodiment, the dummy cells have the same arrangement as that of the unit cells. In order to implement such configurations and arrangements according to this embodiment, two dummy word lines DWL0 and DWL1 are used in such a fashion that one of the dummy word lines, that is, the dummy word line DWL1, is associated with the dummy cells DC0 and DC1 respectively connected to the bit lines BL0 and BL1 (or the inverted bit lines) in odd rows (or even rows) whereas the other dummy word line, that is, the dummy word line DWL2, is associated with the dummy cells DC0' and DC1' respectively connected to the bit lines /BL0 and /BL1 (or the inverted bit lines) in even rows (or odd rows).

In the illustrated case, a single control line CLD is used to erase data stored in all dummy cells. However, two separate control lines may be used to control the dummy cells, as in the dummy word lines.

As apparent from the above description, the FeRAM according to this embodiment has an arrangement in which one dummy cell and one switching transistor are used for every bit line, as compared to the FeRAM of the first embodiment in which one dummy cell and two switching transistors are used for every bit line.

In order to avoid an unnecessarily repeated description for the third embodiment, no description will be made in conjunction with the whole arrangement of the FeRAM according to this embodiment. In the following description, only the procedure for storing data in the FeRAM according to this embodiment using a simplified switching transistor arrangement, and reading out the stored data will be described.

For the convenience and best understanding of description, it is assumed in the following description that an application of a high voltage to the bit line means the fact that the applied voltage is higher than the potential of the plate electrode whereas an application of a low voltage to the bit line means the fact that the applied voltage is lower than the potential of the plate electrode. Also, it is assumed that the potential variation of a bit line when output data is "1" corresponds to "V1", and the potential variation of the bit line when output data is "0" corresponds to "V0".

Since the same data storing and reading procedures are carried out in all unit cells, these procedures will be described only in conjunction with the unit cells C00 and C10'.

First, the procedure for storing data "1" in the unit cell C00 will be described. In order to store data, the word line WL0 is switched to its ON state. In this state, a high voltage is applied to the bit line BL0. Due to a potential difference resulting from such a voltage application, the ferroelectric film included in the unit cell C00 is polarized in a plus (+) direction. Accordingly, data "1" is stored.

Where it is desired to store data "1" in the unit cell C10', the word line WL1 is switched to its ON state. When a high voltage is applied to the bit line /BL0 in this state, the ferroelectric film included in the unit cell C10' is polarized in a plus (+) direction due to a potential difference resulting from the above mentioned voltage application. Accordingly, data "1" is stored.

Now, the procedure for storing data "0" in the unit cell C00 will be described. In order to store data, the word line WL0 is switched to its ON state. In this state, a low voltage is applied to the bit line BL0. Due to a potential difference resulting from such a voltage application, the ferroelectric film included in the unit cell C00 is polarized in a minus (−) direction. Accordingly, data "0" is stored.

Where it is desired to store data "0" in the unit cell C10', the word line WL1 is switched to its ON state. When a high voltage is applied to the bit line /BL0 in this state, the ferroelectric film included in the unit cell C10' is polarized in a minus (-) direction due to a potential difference resulting from the above mentioned voltage application. Accordingly, data "0" is stored.

As apparent from the above description, in the FeRAM according to this embodiment, data "1" or data "0" is stored in respective unit cells C00 and C10' connected to the bit lines BL0 and /BL0 in accordance with voltages (a high voltage or a low voltage) applied to those bit lines in accordance with the above mentioned memory control procedures.

As apparent from the above description, in the FeRAM according to this embodiment, no dummy cell is used in the procedure for storing data in an optional unit cell. Accordingly, it is possible to considerably reduce the number of times using dummy cells. As a result, the number of times repeatedly using the FeRAM is relatively increased.

The procedure for reading out data "1" or "0" stored in the unit cells C00 and C10' in accordance with the above mentioned procedure will now be described.

First, the procedure for reading out data stored in the unit cell C00 will be described. In this procedure, the control line CLD is first switched to its ON state so as to erase data stored in the dummy cells. After the data erasure, the control line CLD is switched again to its OFF state. In this state, a high voltage is applied to two bit lines BL0 and /BL0. Also, the word line WL0 and the dummy word line DWL are switched to their ON states, respectively. In this state, a potential variation of "V1" or "V0" occurs on the bit line BL0 in accordance with the data stored in the unit cell C00. That is, where data "1" is stored in the unit cell C00, the potential variation of the bit line BL0 corresponds to "V1". On the other hand, where data "0" is stored in the unit cell C00, the potential variation of the bit line BL0 corresponds to "V0".

At this time, the potential variation occurring on the inverted bit line /BL0 corresponds to a value approximately intermediate between "dV1" and "dV0" by virtue of the capacitor of the dummy cell DC0'. This potential variation is used as a reference voltage for a determination of data read out from the unit cell C00.

That is, the voltage on the bit line BL0 and the reference voltage on the inverted bit line /BL0 are transmitted to the comparator C0 which, in turn, determines the read-out data, based on the received voltages. When the voltage outputted from the bit line BL0 is higher than the reference voltage outputted from the inverted bit line /BL0, the data read out from the unit cell C00 is determined to be data "1". On the other hand, when the voltage outputted from the bit line BL0 is not higher than the reference voltage outputted from the inverted bit line /BL0, the data read out from the unit cell C00 is determined to be data "0".

In the procedure for reading out data stored in the unit cell C10', the control line CLD is first switched to its ON state so as to erase data stored in the dummy cells. After the data erasure, the control line CLD is switched again to its OFF state. In this state, a high voltage is applied to two bit lines BL0 and /BL0. Also, the word line WL1 and dummy word line DWL are switched to their ON states, respectively. In this state, a potential variation of "V1" or "V0" occurs on the bit line /BL0 in accordance with the data stored in the unit cell C10'. That is, where data "1" is stored in the unit cell C10', the potential variation of the bit line /BL0 corresponds to "V1". On the other hand, where data "0" is stored in the unit cell C10', the potential variation of the bit line /BL0 corresponds to "V0".

At this time, the potential variation occurring on the inverted bit line BL0 corresponds to a value approximately intermediate between "dV1" and "dV0" by virtue of the capacitor of the dummy cell DC0. This potential variation is used as a reference voltage for a determination of data read out from the unit cell C10'.

That is, the voltage on the bit line /BL0 and the reference voltage on the inverted bit line BL0 are transmitted to the comparator C0 which, in turn, determines the read-out data, based on the received voltages. When the voltage outputted from the bit line /BL0 is higher than the reference voltage outputted from the inverted bit line BL0, the data read out from the unit cell C10' is determined to be data "1". On the other hand, when the voltage outputted from the bit line /BL0 is not higher than the reference voltage outputted from the inverted bit line BL0, the data read out from the unit cell C10' is determined to be data "0".

Thus, the FeRAM according to this embodiment uses no dummy cell in the procedure for storing data an optional unit cell while using a dummy cell in the procedure for reading out data from an optional unit cell.

As apparent from the above description, the FeRAM according to this embodiment obtains the same effects as those of the first embodiment because the FeRAM is configured to use no dummy cell in the procedure for storing data an optional unit cell while using a dummy cell associated with a unit cell in the procedure for reading out data from the unit cell. That is, it is possible to effectively prevent the number of times repeatedly using the FeRAM from being reduced, and to achieve a high integration of the FeRAM.

Alternatively, a single plate electrode is used in common for memory cells, in place of separate plate electrode lines, as in the first embodiment. By virtue of such a configuration, it is possible to achieve an increase in capacitance within a given area.

In accordance with this embodiment, the capacitors of the dummy cells may be formed using a separate capacitor fabrication process. Alternatively, gate capacitors may be used which use a gate insulating film as a dielectric film thereof.

Figure 4B:
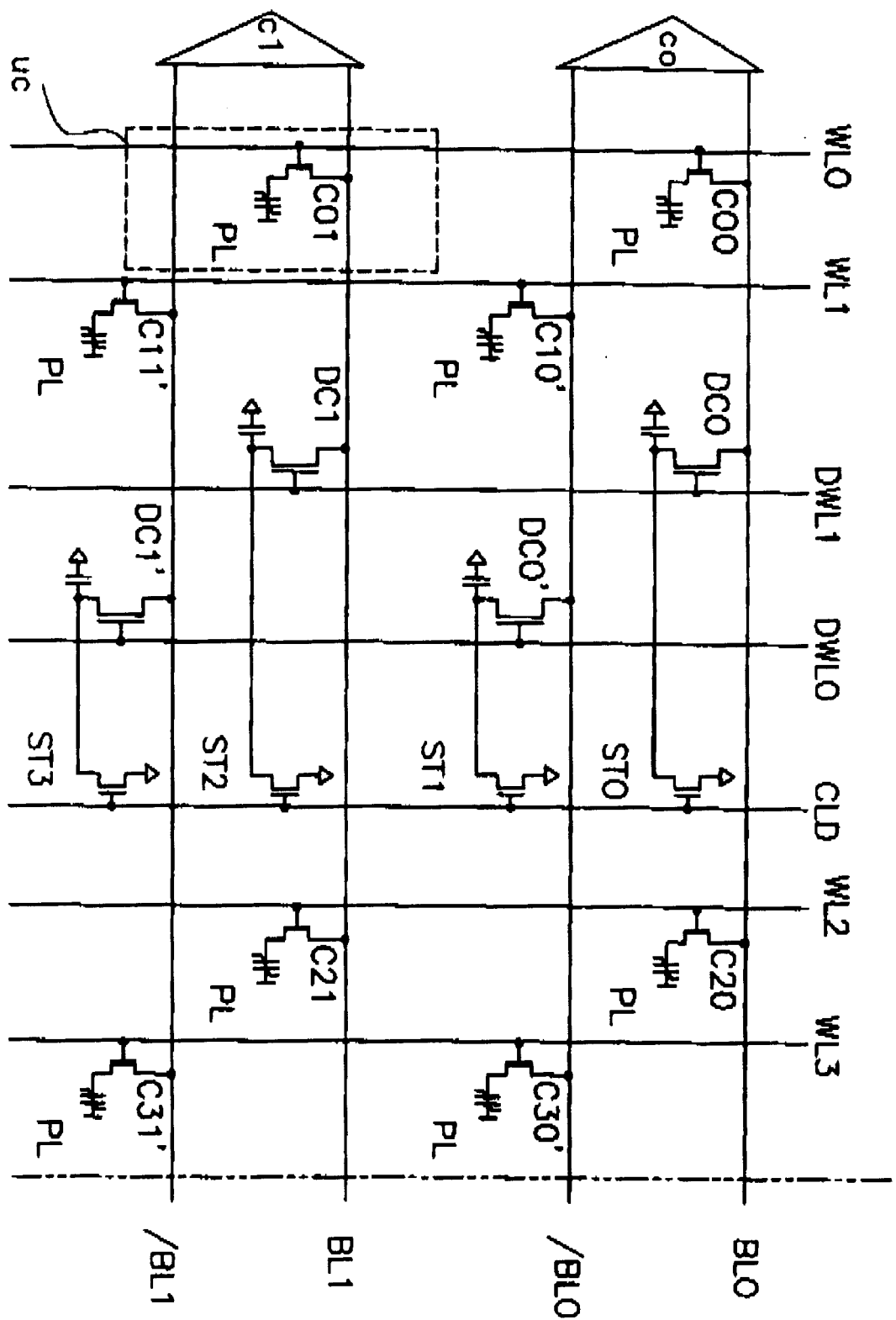
FIG. 4b is an equivalent circuit diagram illustrating a part of an FeRAM according to a second modified embodiment from the second embodiment of the present invention.

FIG. 4b is an equivalent circuit diagram illustrating a part of an FeRAM according to a first modified one of the third embodiment of the present invention.

Referring to FIG. 4b, this first modified embodiment has the same configuration and arrangement as those of the third embodiment, except that the dummy cells DC0, DC0', DC1, and DC1' and switching transistors ST0 to ST3 are arranged at optional positions between unit cells neighboring to each other in a row direction, respectively.

In the FeRAM according to the first modified embodiment, the procedures for inputting data to an optional unit cell, and reading out data stored in the optional unit cell are the same as those in the first embodiment. Accordingly, no further description will be made in conjunction with those procedures.

This first modified embodiment illustrates the fact that the dummy cells may be arranged at optional positions between unit cells neighboring to each other in a row direction, respectively.

Although the FeRAM according to the first modified embodiment has slightly different configurations from those of the third embodiment in that the dummy cells are arranged at optional positions between unit cells neighboring to each other in a row direction, respectively, the same effect as that of the first embodiment can be obtained.

Figure 4C:
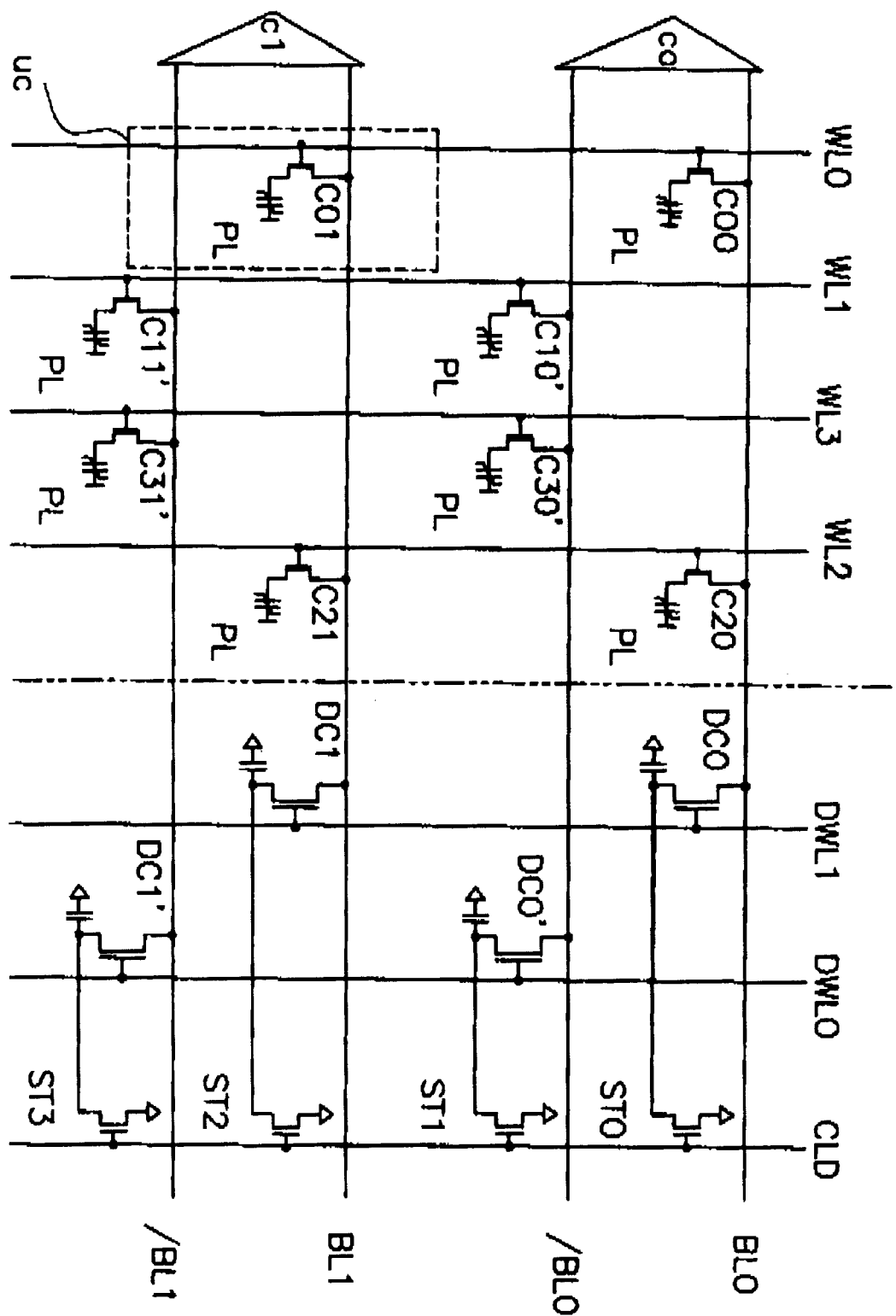
FIG. 4c is an equivalent circuit diagram illustrating a part of an FeRAM according to a second modified embodiment from the third embodiment of the present invention.

FIG. 4c is an equivalent circuit diagram illustrating a part of an FeRAM according to a second modified one of the third embodiment of the present invention.

Referring to FIG. 4c, this second modified embodiment has the same configuration and arrangement as those of the third embodiment, except that the unit cells of the same row connected in series on each of bit lines BL0, /BL0, BL1, and /BL1 are arranged in pair.

In the FeRAM according to this second modified embodiment, the procedures for inputting data "1" or "0" to an optional unit cell, and reading out data stored in the optional unit cell are the same as those in the third embodiment. Accordingly, no further description will be made in conjunction with those procedures, in order to avoid an unnecessarily repeated description.

Although the FeRAM according to the second modified embodiment has slightly different configurations from those of the third embodiment in that the unit cells of the same row connected in series on each bit line are arranged in pair, the same effect as that of the first embodiment can be obtained.

[Fourth Embodiment]

Figure 5:
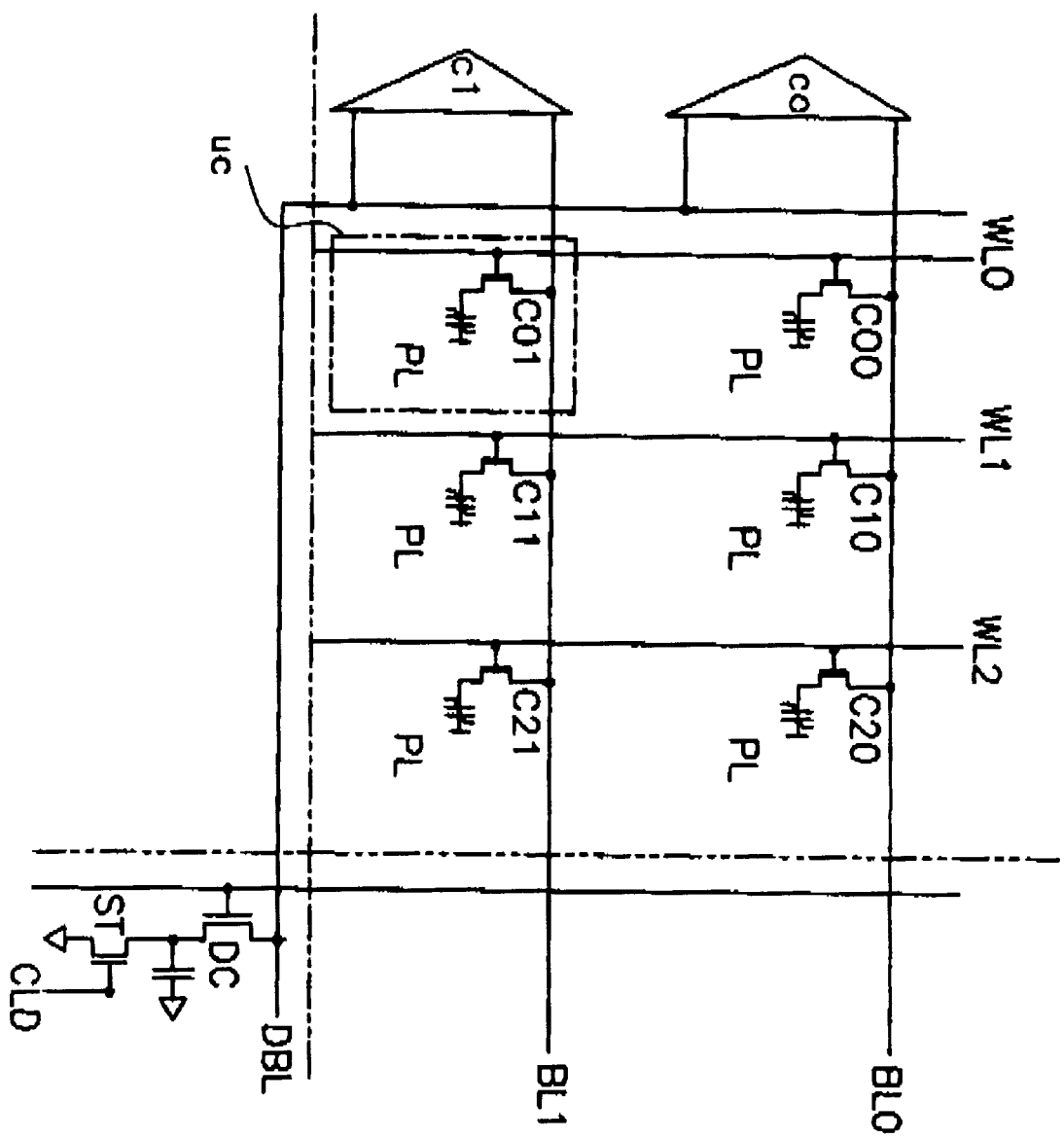
FIG. 5 is an equivalent circuit diagram illustrating a part of an FeRAM in accordance with a fourth embodiment of the present invention.

FIG. 5 is an equivalent circuit diagram illustrating a part of an FeRAM in accordance with a fourth embodiment of the present invention.

Referring to FIG. 5, the FeRAM according to this embodiment is different from those of the first through third embodiments in which in the procedure for reading out data stored in an unit cell, the dummy cell connected to the bit line neighboring to the bit line, on which data is read out, is used to generate a reference voltage required for a determination of the read data. That is, in the FeRAM according to this embodiment, a single dummy cell DC is used to generate a reference voltage. The dummy cell DC is connected to a separate dummy bit line DBL. The dummy cell DC is also connected in parallel to a plurality of comparators C0 and C1.

Figure 6:
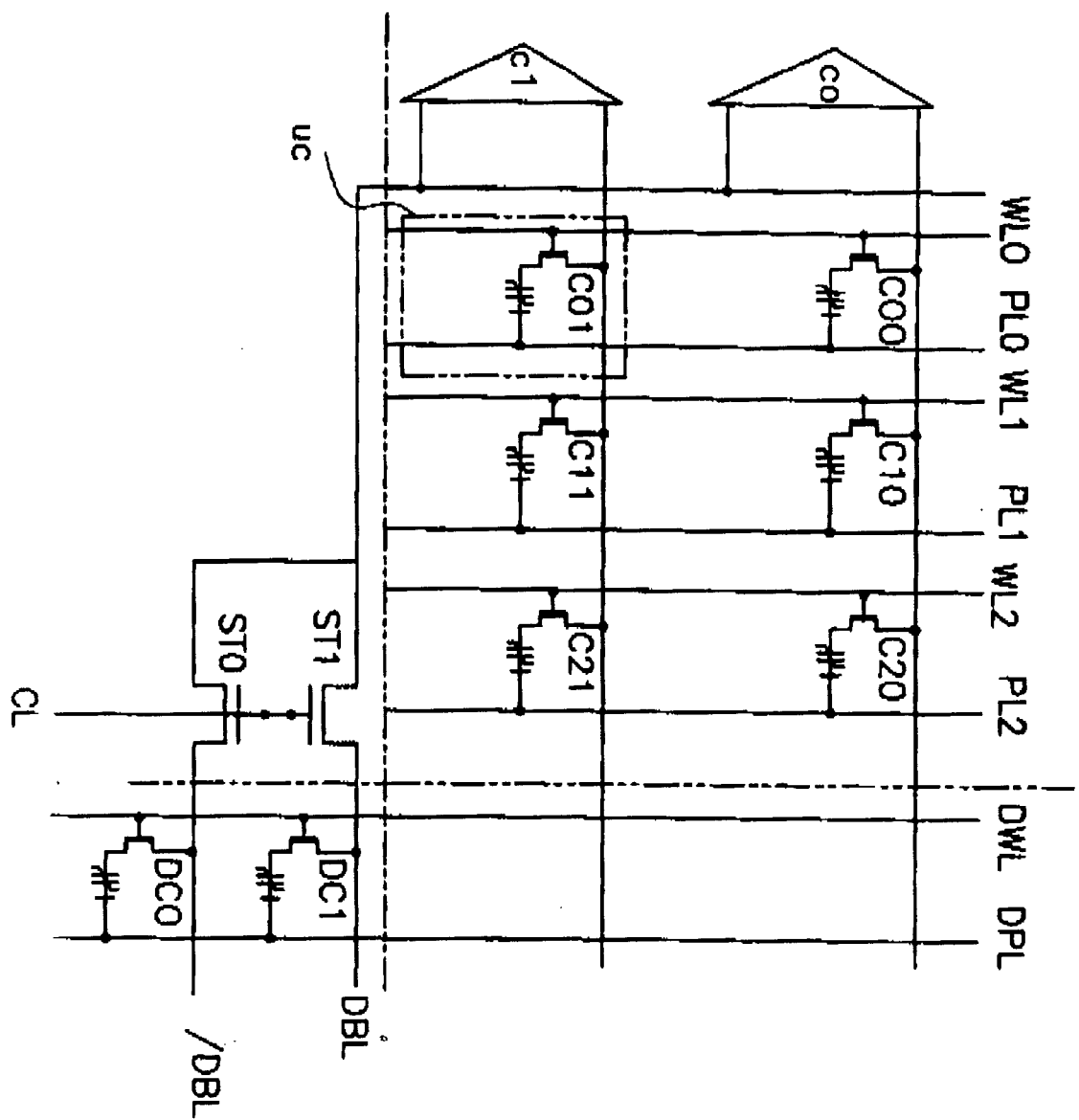
FIG. 6 is a circuit diagram illustrating the equivalent circuit of a conventional FeRAM having a 1T/1C structure.
Figure 7:
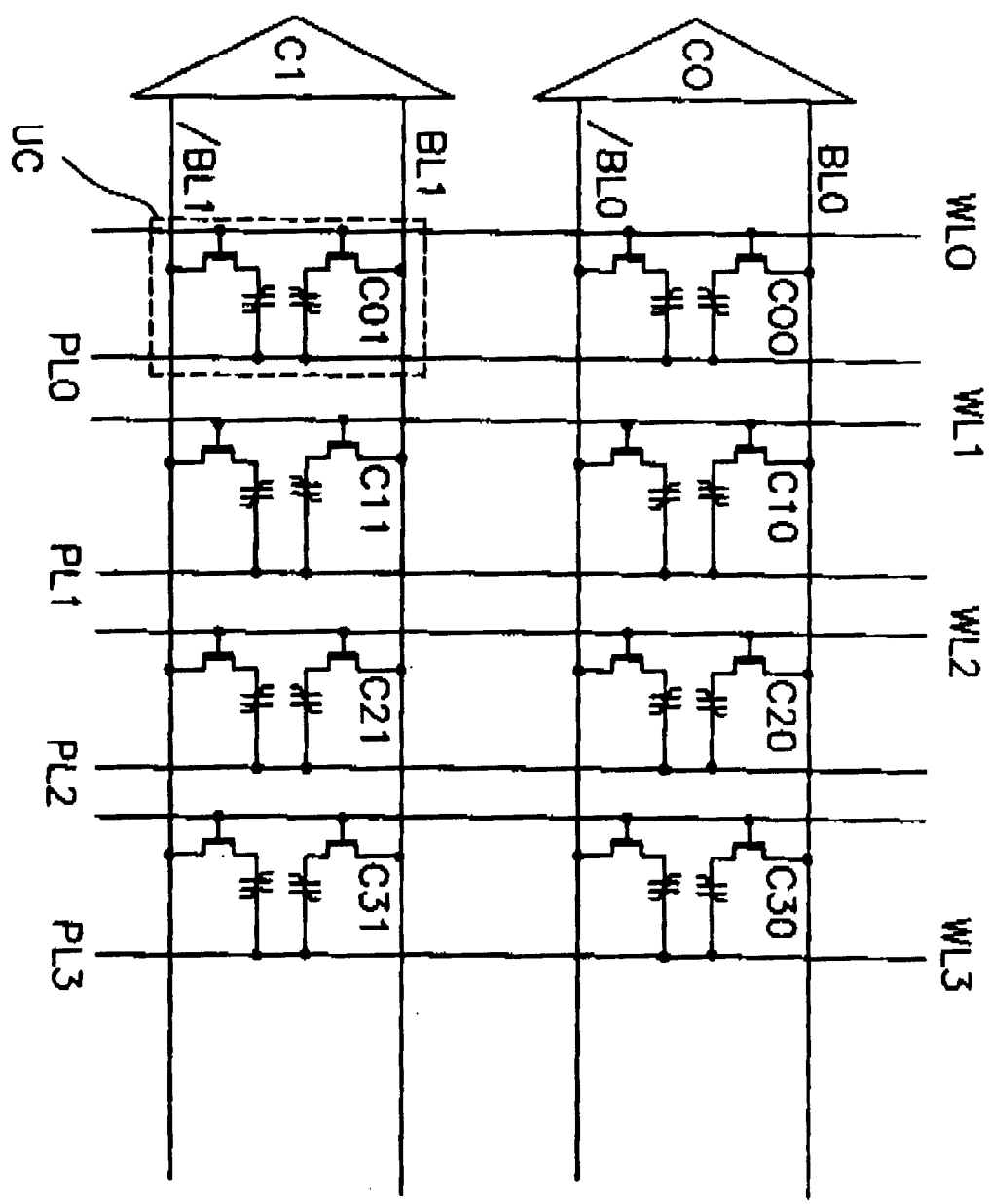
FIG. 7 is a circuit diagram illustrating the equivalent circuit of another conventional FeRAM having a 2T/2C structure.

This FeRAM of the fourth embodiment is slightly similar to the conventional FeRAM of FIG. 6 in that a single dummy cell DC is connected to a separate dummy bit line DBL. However, the FeRAM of this embodiment is apparently different from the conventional FeRAM of FIG. 6 in that it includes a single dummy cell DC and a single switching transistor, and that the dummy cell is not used in the procedure for storing data in an optional unit cell, but used only in the procedure for reading out data from an optional unit cell.

The procedures for storing data in respective unit cells C00 and C10' are the same as those in the above mentioned embodiments. In the following description, accordingly, only the procedures for reading out data stored in respective unit cells C00 and C01 will be described in order to avoid an unnecessarily repeated description.

First, the procedure for reading out data stored in the unit cell C00 will be described. In this procedure, the control line CLD is first switched to its ON state so as to erase data stored in the dummy cells. After the data erasure, the control line CLD is switched again to its OFF state. In this state, a high voltage is applied to the bit line BL0 and the dummy bit line DBL. Also, the word line WL0 and dummy word line DWL are switched to their ON states, respectively. In this state, a potential variation of "V1" or "V0" occurs on the bit line BL0 in accordance with the data stored in the unit cell C00. That is, where data "1" is stored in the unit cell C00, the potential variation of the bit line BL0 corresponds to "V1". On the other hand, where data "0" is stored in the unit cell C00, the potential variation of the bit line BL0 corresponds to "V0".

At this time, the potential variation occurring on the dummy bit line DBL corresponds to a value approximately intermediate between "dV1" and "dV0" by virtue of the capacitor of the dummy cell DC0'. This potential variation is used as a reference voltage for a determination of data read out from the unit cell C00.

That is, the voltage on the bit line BL0 and the reference voltage on the dummy bit line DBL are transmitted to the comparator C0 which, in turn, determines the read-out data, based on the received voltages. When the voltage outputted from the bit line BL0 is higher than the reference voltage outputted from the dummy bit line DBL, the data read out from the unit cell C00 is determined to be data "1". On the other hand, when the voltage outputted from the bit line BL0 is not higher than the reference voltage outputted from the dummy bit line DBL, the data read out from the unit cell C00 is determined to be data "0".

In the procedure for reading out data stored in the unit cell C01, the control line CLD is first switched to its ON state so as to erase data stored in the dummy cells. After the data erasure, the control line CLD is switched again to its OFF state. In this state, a high voltage is applied to the bit line BL1 and dummy bit line DBL. Also, the word line WL0 and dummy word line DWL are switched to their ON states, respectively. In this state, a potential variation of "V1" or "V0" occurs on the bit line BL1 in accordance with the data stored in the unit cell C01. That is, where data "1" is stored in the unit cell C01, the potential variation of the bit line BL1 corresponds to "V1". On the other hand, where data "0" is stored in the unit cell C01, the potential variation of the bit line BL1 corresponds to "V0".

At this time, the potential variation occurring on the dummy bit line DBL corresponds to a value approximately intermediate between "dV1" and "dV0" by virtue of the capacitor of the dummy cell DC. This potential variation is used as a reference voltage for a determination of data read out from the unit cell C01.

That is, the voltage on the bit line BL1 and the reference voltage on the dummy bit line DBL are transmitted to the comparator C0 which, in turn, determines the read-out data, based on the received voltages. When the voltage outputted from the bit line BL1 is higher than the reference voltage outputted from the dummy bit line DBL, the data read out from the unit cell C01 is determined to be data "1". On the other hand, when the voltage outputted from the bit line BL1 is not higher than the reference voltage outputted from the dummy bit line DBL, the data read out from the unit cell C01 is determined to be data "0".

Thus, the FeRAM according to this embodiment uses no dummy cell in the procedure for storing data an optional unit cell while using a dummy cell in the procedure for reading out data from an optional unit cell.

As apparent from the above description, the FeRAM according to this embodiment obtains the same effects as those of the first embodiment because the FeRAM is configured to use no dummy cell in the procedure for storing data an optional unit cell while using a dummy cell associated with a unit cell in the procedure for reading out data from the unit cell. That is, it is possible to effectively prevent the number of times repeatedly using the FeRAM from being reduced, and to achieve a high integration of the FeRAM.

Alternatively, a single plate electrode is used in common for memory cells, in place of separate plate electrode lines, as in the first embodiment. By virtue of such a configuration, it is possible to achieve an increase in capacitance within a given area.

In accordance with this embodiment, the capacitors of the dummy cells may be formed using a separate capacitor fabrication process. Alternatively, gate capacitors may be used which use a gate insulating film as a dielectric film thereof.

As apparent from the above description, the present invention provides an FeRAM which includes M×N unit cells, each unit cell having a 1T/1C structure consisting of one transistor and one capacitor, dummy cells provided for respective bit lines and adapted to generate a reference voltage required for a data determination, and switching transistors respectively corresponding to the dummy cells. Alternatively, a single dummy cell is used which is connected to a separate dummy bit line. In accordance with the ON/OFF control of the switching transistors corresponding to a selected dummy cell, this selected dummy cell is used only when data is read out from an associated unit cell. Accordingly, it is possible to minimize the number of times using dummy cells for a generation of the reference voltage, thereby effectively preventing the number of times repeatedly using the FeRAM from being reduced, and to achieve a high integration of the FeRAM.

Alternatively, a single plate electrode is used in common for memory cells, in place of plate electrode lines separated from one another in a row or column direction. By virtue of such a configuration, it is possible to achieve an increase in capacitance within a given area. A ferroelectric film is used for the capacitor of each unit cell, and a typical dielectric film exhibiting a superior resistance to a fatigue degradation over the ferroelectric film is used for the capacitor of each dummy cell. Accordingly, it is possible to achieve an enhanced reliability of the dummy cells.

Although the preferred embodiments of the invention have been disclosed for illustrative purposes, those skilled in the art will appreciate that various modification, additions and substitutions are possible, without departing from the scope and spirit of the invention as disclosed in the accompanying claims.

What is claimed is:

1. A ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

further comprising:

a dummy cell group consisting of a plurality of dummy cells each connected to an associated one of the bit lines at an optional position on the associated bit line, each of the dummy cells consisting of one transistor and one capacitor;

a first switching transistor group consisting of a plurality of switching transistors each serving to switch a connection among associated ones of the unit cells on one of the bit lines corresponding to an associated one of the dummy cells in response to a control signal externally applied thereto; and a second switching transistor group consisting of a plurality of switching transistors each serving to erase data stored in an associated one of the dummy cells in response to a control signal externally applied thereto;

wherein respective capacitors of the dummy cells are made of a dielectric film having no spontaneous polarization characteristic;

whereby when data is read out from an optional one of the unit cells on a selected one of the bit lines, a predetermined voltage outputted from that of dummy cells connected to an inverted bit line neighboring to the selected bit line is provided as a reference voltage required for a comparison with a voltage corresponding to the read-out data.

2. The ferroelectric random access memory according to claim 1, wherein the dummy cell groups and the first and second switching transistor groups are arranged at optional positions within a selected one of the unit cell groups, respectively, in such a fashion that they separate each of the bit lines into two portions, the separated bit line portions being connected by an interconnection line.

3. The ferroelectric random access memory according to claim 2, wherein respective plate electrodes of the unit cells are connected to plate electrode lines spaced from one another in a row direction in such a fashion that one of unit cell groups each consisting of N unit cells is connected to an associated one of the plate electrode lines.

4. The ferroelectric random access memory according to claim 2, wherein respective plate electrodes of the unit cells are connected in common by a plate electrode line.

5. The ferroelectric random access memory according to claim 2, wherein respective plate electrodes of the dummy cells are connected to the ground.

6. The ferroelectric random access memory according to claim 2, wherein a predetermined voltage is applied to respective plate electrodes of the dummy cells.

7. The ferroelectric random access memory according to claim 2, wherein two unit cells are arranged in pair on each of the bit lines in such a fashion that they are connected together in series, and the unit cell pairs are arranged in an alternating fashion between neighboring ones of the bit lines.

8. The ferroelectric random access memory according to claim 2, wherein the bit lines are arranged in pair to form bit line pairs each consisting of two bit lines, the dummy cells connected to respective one-side bit lines of the bit line pairs are connected in common to a dummy word line, and the dummy cells connected to respective other-side bit lines of the bit line pairs are connected in common to another dummy word line.

9. The ferroelectric random access memory according to claim 2, wherein respective capacitors of the unit cells are made of a ferroelectric film, and respective capacitors of the dummy cells are made of a dielectric film.

10. The ferroelectric random access memory according to claim 9, wherein the capacitor of each dummy cell is a gate capacitor using a dielectric film as a gate insulating film thereof.

11. The ferroelectric random access memory according to claim 2, wherein the first switching transistor group comprises:

a first switching group consisting of a plurality of switching transistors respectively arranged on those of the bit lines corresponding to one of two interlaced bit line groups each consisting of interlaced bit lines, each of the switching transistors in the first switching group serving to switch a connection of the dummy cell, arranged on an associated one of the bit lines in the one interlaced bit line group, to the associated bit line, the switching transistors in the first switching group being connected in common to a first control line; and a second switching group consisting of a plurality of switching transistors respectively arranged on those of the bit lines corresponding to the other one of the interlaced bit line groups, each of the switching transistors in the second switching group serving to switch a connection of the dummy cell, arranged on an associated one of the bit lines in the other interlaced bit line group, to the associated bit line, the switching transistors in the second switching group being connected in common to a second control line.

12. The ferroelectric random access memory according to claim 11, wherein when data is stored in an optional one of the unit cells, the first and second switching groups are controlled to be switched to OFF states thereof in response to a switching control signal externally applied thereto, respectively.

13. The ferroelectric random access memory according to claim 11, wherein when data is read out from an optional one of the unit cells, the first and second switching groups are controlled in such a fashion that one of the first and second switching groups is switched to an ON state thereof in response to a switching control signal externally applied thereto whereas the other one of the first and second switching groups is switched to an OFF state thereof in response to a switching control signal externally applied thereto.

14. A ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

wherein the bit lines are arranged in pair, each of the bit line pairs consisting of two bit lines;

further comprising:

a dummy cell group consisting of a plurality of dummy cells each connected to one of bit lines included in an associated one of the bit line pairs at an optional position on the bit line, each of the dummy cells consisting of one transistor and one capacitor;

a first switching transistor group consisting of a plurality of switching transistors each serving to switch a connection among the unit cells on one bit line included in an associated one of the bit line pairs respectively corresponding to the dummy cells in response to a control signal externally applied thereto;

a second switching transistor group consisting of a plurality of switching transistors each serving to switch a connection between the bit lines included in an associated one of the bit line pairs respectively corresponding to the dummy cells in response to a control signal externally applied thereto, the switching transistors of the second switching transistor group corresponding in number to the dummy cells; and a third switching transistor group consisting of a plurality of switching transistors each serving to erase data stored in an associated one of the dummy cells in response to a control signal externally applied thereto;

wherein respective capacitors of the dummy cells are made of a dielectric film having no spontaneous polarization characteristic;

whereby when data is read out from an optional one of the unit cells on a selected one of the bit lines, a predetermined voltage outputted from that of dummy cells connected to the bit line pair including the selected bit line is provided pair as a reference voltage required for a comparison with a voltage corresponding to the read-out data.

15. The ferroelectric random access memory according to claim 14, wherein the dummy cell groups and the first through third switching transistor groups are arranged at optional positions within a selected one of the unit cell groups, respectively, in such a fashion that they separate each of the bit lines into two portions, the separated bit line portions being connected by an interconnection line.

16. The ferroelectric random access memory according to claim 15, wherein respective plate electrodes of the unit cells are connected to plate electrode lines spaced from one another in a row direction in such a fashion that one of unit cell groups each consisting of N unit cells is connected to an associated one of the plate electrode lines.

17. The ferroelectric random access memory according to claim 15, wherein respective plate electrodes of the unit cells are connected in common by a plate electrode line.

18. The ferroelectric random access memory according to claim 15, wherein respective plate electrodes of the dummy cells are connected to the ground.

19. The ferroelectric random access memory according to claim 15, wherein a predetermined voltage is applied to respective plate electrodes of the dummy cells.

20. The ferroelectric random access memory according to claim 15, wherein respective plate electrodes of the unit cells are connected in common by a plate electrode line, to which a predetermined voltage is applied, and respective plate electrodes of the dummy cells are connected to the ground.

21. The ferroelectric random access memory according to claim 15, wherein two unit cells are arranged in pair on each of the bit lines in such a fashion that they are connected together in series, and the unit cell pairs are arranged in an alternating fashion between neighboring ones of the bit lines.

22. The ferroelectric random access memory according to claim 15, wherein the dummy cells are connected in common to a single dummy word line.

23. The ferroelectric random access memory according to claim 15, wherein respective capacitors of the unit cells are made of a ferroelectric film, and respective capacitors of the dummy cells are made of a dielectric film.

24. The ferroelectric random access memory according to claim 23, wherein the capacitor of each dummy cell is a gate capacitor using a dielectric film as a gate insulating film thereof.

25. The ferroelectric random access memory according to claim 15, wherein the first switching transistor group comprises:

a first switching group consisting of a plurality of switching transistors respectively arranged on those of the bit lines corresponding to one of two interlaced bit line groups each consisting of interlaced bit lines, each of the switching transistors in the first switching group serving to switch a connection of the dummy cell, arranged on an associated one of the bit lines in the one interlaced bit line group, to the associated bit line, the switching transistors in the first switching group being connected in common to a first control line; and a second switching group consisting of a plurality of switching transistors respectively arranged on those of the bit lines corresponding to the other one of the interlaced bit line groups, each of the switching transistors in the second switching group serving to switch a connection of the dummy cell, arranged on an associated one of the bit lines in the other interlaced bit line group, to the associated bit line, the switching transistors in the second switching group being connected in common to a second control line.

26. The ferroelectric random access memory according to claim 25, wherein when data is stored in an optional one of the unit cells, the first and second switching groups are controlled to be switched to OFF states thereof in response to a switching control signal externally applied thereto, respectively.

27. The ferroelectric random access memory according to claim 25, wherein when data is read out from an optional one of the unit cells, the first and second switching groups are controlled in such a fashion that one of the first and second switching groups is switched to an ON state thereof in response to a switching control signal externally applied thereto whereas the other one of the first and second switching groups is switched to an OFF state thereof in response to a switching control signal externally applied thereto.

28. A ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

wherein the bit lines are grouped into bit line groups each consisting of N bit lines;

further comprising:

a dummy cell group consisting of a plurality of dummy cells each connected to one of bit lines included in an associated one of the bit line pairs at an optional position on the bit line, each of the dummy cells consisting of one transistor and one capacitor;

a first switching transistor group consisting of a plurality of switching transistors each serving to switch a connection among the unit cells on one bit line included in an associated one of the bit line groups respectively corresponding to the dummy cells in response to a control signal externally applied thereto;

a second switching transistor group consisting of a plurality of switching transistors each serving to switch a connection between the bit lines included in an associated one of the bit line groups respectively corresponding to the dummy cells in response to a control signal externally applied thereto; and a third switching transistor group consisting of a plurality of switching transistors each serving to erase data stored in an associated one of the dummy cells in response to a control signal externally applied thereto;

wherein respective capacitors of the dummy cells are made of a dielectric film having no spontaneous polarization characteristic;

whereby when data is read out from an optional one of the unit cells on a selected one of the bit lines, a predetermined voltage outputted from an inverted bit line neighboring to the bit line group including the selected bit line is provided as a reference voltage required for a comparison with a voltage corresponding to the read-out data.

29. The ferroelectric random access memory according to claim 28, wherein respective plate electrodes of the unit cells are connected to plate electrode lines spaced from one another in a row direction in such a fashion that one of unit cell groups each consisting of N unit cells is connected to an associated one of the plate electrode lines.

30. The ferroelectric random access memory according to claim 28, wherein respective plate electrodes of the unit cells are connected in common by a plate electrode line.

31. The ferroelectric random access memory according to claim 28, wherein respective plate electrodes of the dummy cells are connected to the ground.

32. The ferroelectric random access memory according to claim 28, wherein a predetermined voltage is applied to respective plate electrodes of the dummy cells.

33. The ferroelectric random access memory according to claim 28, wherein when each of the bit line groups consists of four bit lines, a first one of the four bit lines being connected with an associated one of the dummy cells, the second switching transistor group comprises:

first switching transistors each serving to connect the first bit line of an associated one of the bit line groups with a second one of the bit lines included in the associated bit line group between an associated dummy cell and the unit cells;

second switching transistors each serving to connect the first bit line of an associated one of the bit line groups with a third one of the bit lines included in the associated bit line group between an associated dummy cell and the unit cells; and third switching transistors each serving to connect the first bit line of an associated one of the bit line groups with a fourth one of the bit lines included in the associated bit line group between an associated dummy cell and the unit cells.

34. The ferroelectric random access memory according to claim 33, wherein when data is read out from an optional one of the unit cells on a selected one of the four bit lines, one of the first through third switching transistors are controlled to be switched to an ON state thereof whereas the remaining switching transistors are controlled to be switched to OFF states thereof, respectively.

35. A ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

further comprising:
a dummy cell group divided into a first dummy cell group consisting of a plurality of dummy cells connected in common to a first dummy word line, and a second dummy cell group consisting of a plurality of dummy cells connected in common to a second dummy word line, each of the dummy cells consisting of one transistor and one capacitor; and a switching transistor group consisting of a plurality of switching transistors each serving to erase data stored in an associated one of the dummy cells in response to a control signal externally applied thereto;

wherein respective capacitors of the dummy cells are made of a dielectric film having no spontaneous polarization characteristic;

whereby when data is read out from an optional one of the unit cells on a selected one of the bit lines, a predetermined voltage outputted from that of dummy cells connected to an inverted bit line neighboring to the selected bit line is provided as a reference voltage required for a comparison with a voltage corresponding to the read-out data.

36. The ferroelectric random access memory according to claim 35, wherein the dummy cell groups and the switching transistor group are arranged at optional positions within a selected one of the unit cell groups, respectively.

37. The ferroelectric random access memory according to claim 36, wherein respective plate electrodes of the unit cells are connected to plate electrode lines spaced from one another in a row direction in such a fashion that one of unit cell groups each consisting of N unit cells is connected to an associated one of the plate electrode lines.

38. The ferroelectric random access memory according to claim 36, wherein respective plate electrodes of the unit cells are connected in common by a plate electrode line.

39. The ferroelectric random access memory according to claim 36, wherein respective plate electrodes of the dummy cells are connected to the ground.

40. The ferroelectric random access memory according to claim 36, wherein a predetermined voltage is applied to respective plate electrodes of the dummy cells.

41. The ferroelectric random access memory according to claim 36, wherein two unit cells are arranged in pair on each of the bit lines in such a fashion that they are connected together in series, and the unit cell pairs are arranged in an alternating fashion between neighboring ones of the bit lines.

42. The ferroelectric random access memory according to claim 36, wherein respective capacitors of the unit cells are made of a ferroelectric film, and respective capacitors of the dummy cells are made of a dielectric film.

43. The ferroelectric random access memory according to claim 42, wherein the capacitor of each dummy cell is a gate capacitor using a dielectric film as a gate insulating film thereof.

44. The ferroelectric random access memory according to claim 36, wherein when data is stored in an optional one of the unit cells, one of the first and second switching groups is controlled to be switched to an OFF state thereof in response to a switching control signal externally applied thereto, respectively, and the other switching group is controlled to be switched to an ON state thereof in response to a switching control signal externally applied thereto.

45. A ferroelectric random access memory comprising a plurality of bit lines extending in one direction, a plurality of word lines extending in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines while being connected to a plurality of word lines, respectively, in such a fashion that they are arranged in an aligned fashion in a column direction, those of the bit lines connected to each of the bit lines being connected together in series;

further comprising:
a dummy cell connected to a dummy bit line and adapted to provide, to a selected one of the bit lines, a reference voltage required for a data determination when data is read out, the dummy cell consisting of one transistor and one capacitor; and a switching transistor serving to erase data stored in the dummy cell in response to a control signal externally applied thereto;

wherein the capacitor of the dummy cell is made of a dielectric film having no spontaneous polarization characteristic;

whereby when data is read out from an optional one of the unit cells on a selected one of the bit lines, a predetermined voltage outputted from the dummy cell connected to the dummy bit line is provided as a reference voltage required for a comparison with a voltage corresponding to the read-out data.

46. The ferroelectric random access memory according to claim 45, wherein respective plate electrodes of the unit cells are connected to plate electrode lines spaced from one another in a row direction in such a fashion that one of unit cell groups each consisting of N unit cells is connected to an associated one of the plate electrode lines.

47. The ferroelectric random access memory according to claim 45, wherein respective plate electrodes of the unit cells are connected in common by a plate electrode line.

48. The ferroelectric random access memory according to claim 45, wherein respective plate electrodes of the dummy cells are connected to the ground.

49. The ferroelectric random access memory according to claim 45, wherein a predetermined voltage is applied to a plate electrode of the dummy cell.

50. The ferroelectric random access memory according to claim 45, wherein respective capacitors of the unit cells are made of a ferroelectric film, and the capacitor of the dummy cell is made of a dielectric film.

51. The ferroelectric random access memory according to claim 45, wherein the capacitor of the dummy cell is a gate capacitor using a dielectric film as a gate insulating film thereof.

* * * * *